United States Patent
Iida

(10) Patent No.: US 10,115,883 B2
(45) Date of Patent: Oct. 30, 2018

(54) DEVICE USING A PIEZOELECTRIC ELEMENT AND METHOD FOR MANUFACTURING THE SAME

(71) Applicant: ROHM CO., LTD., Kyoto (JP)

(72) Inventor: Kunio Iida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 448 days.

(21) Appl. No.: 14/843,987

(22) Filed: Sep. 2, 2015

(65) Prior Publication Data

US 2016/0072039 A1 Mar. 10, 2016

(30) Foreign Application Priority Data

Sep. 4, 2014 (JP) .................. 2014-180486
Sep. 4, 2014 (JP) .................. 2014-180488
Jul. 14, 2015 (JP) .................. 2015-140650

(51) Int. Cl.
| | |
|---|---|
| *H01L 41/04* | (2006.01) |
| *H01L 41/047* | (2006.01) |
| *H01L 41/09* | (2006.01) |
| *H01L 41/29* | (2013.01) |
| *B41J 2/14* | (2006.01) |
| *B41J 2/16* | (2006.01) |

(52) U.S. Cl.
CPC ........ *H01L 41/047* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1646* (2013.01); *H01L 41/0973* (2013.01); *H01L 41/29* (2013.01); *B41J 2002/14241* (2013.01); *B41J 2002/14491* (2013.01)

(58) Field of Classification Search
CPC ... H01L 41/047; B41J 2/14233; B41J 2/1607; B41J 2/161
USPC .......................... 310/324, 348, 351
See application file for complete search history.

(56) References Cited

U.S. PATENT DOCUMENTS

2012/0030915 A1* 2/2012 Shimizu .................. B41J 2/161
29/25.35
2013/0265370 A1 10/2013 Nagahata

FOREIGN PATENT DOCUMENTS

| JP | 2013-119182 A | 6/2013 |
| JP | 2013-215930 A | 10/2013 |

* cited by examiner

*Primary Examiner* — Derek Rosenau
(74) *Attorney, Agent, or Firm* — Rabin & Berdo, P.C.

(57) ABSTRACT

An inkjet printing head 1 includes a pressure chamber (cavity) 5, a movable film 10A defining a top surface portion of the pressure chamber 5, and a piezoelectric element 9 disposed above the movable film 10A. The piezoelectric element 9 includes a lower electrode 11 formed above the movable film 10A, a piezoelectric film 12 formed above the lower electrode 11, and an upper electrode 13 formed above the piezoelectric film 12. One end portion of an upper wiring 17 is connected to an upper surface of the upper electrode 13. The upper wiring 17 extends from above the upper electrode 13, crosses an outer edge of the pressure chamber 5, and extends outside the pressure chamber 5. The piezoelectric film 12 has an active portion 12A with an upper surface in contact with a lower surface of the upper electrode 13 and an inactive portion 12B extending along a lower surface of the upper wiring 17 from one end portion of the active portion 12A to outside the pressure chamber 5.

16 Claims, 28 Drawing Sheets

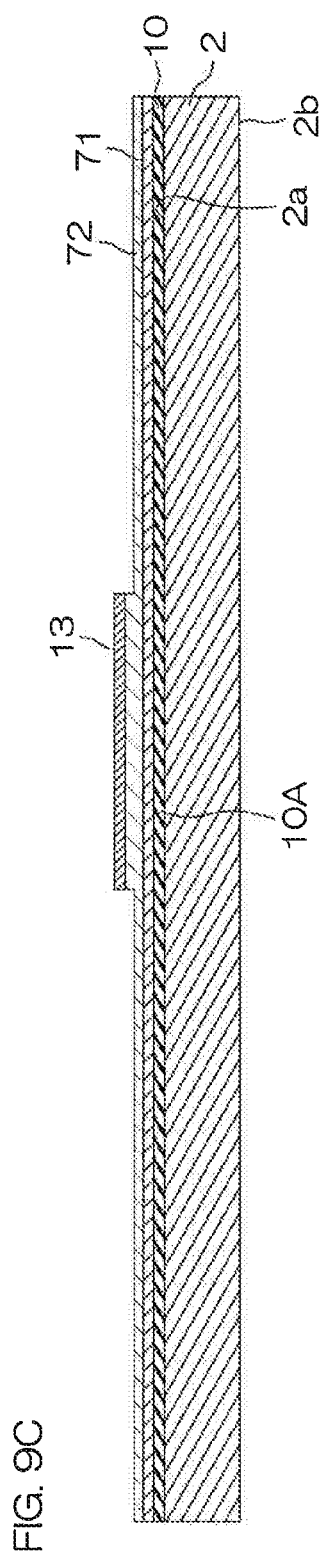

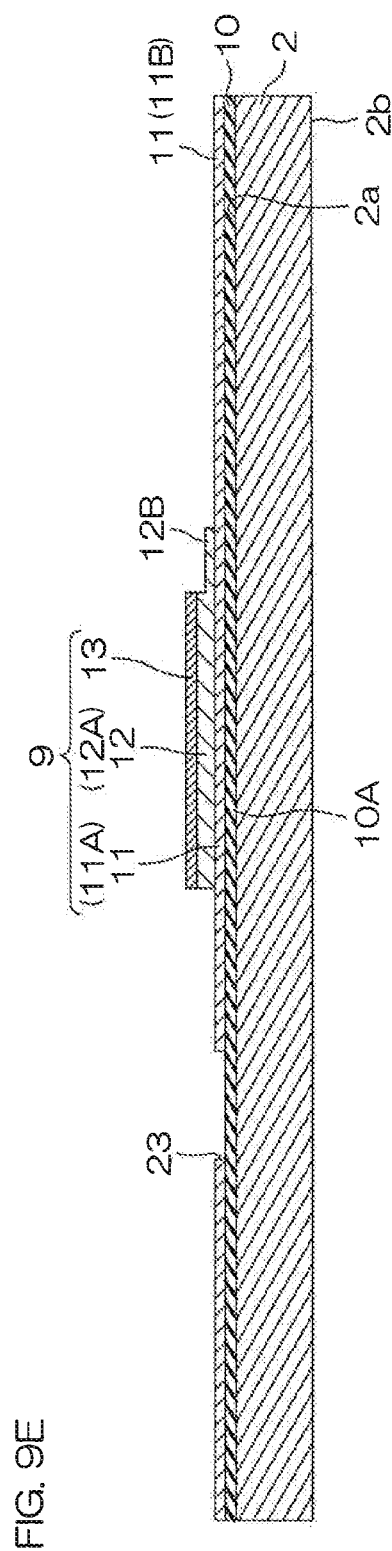

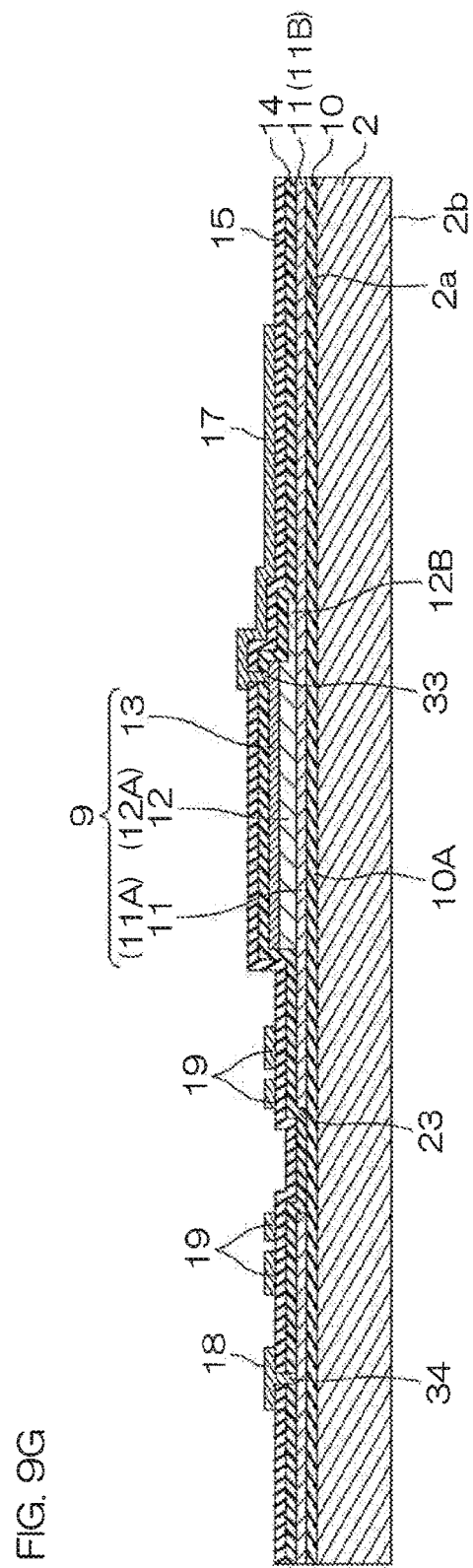

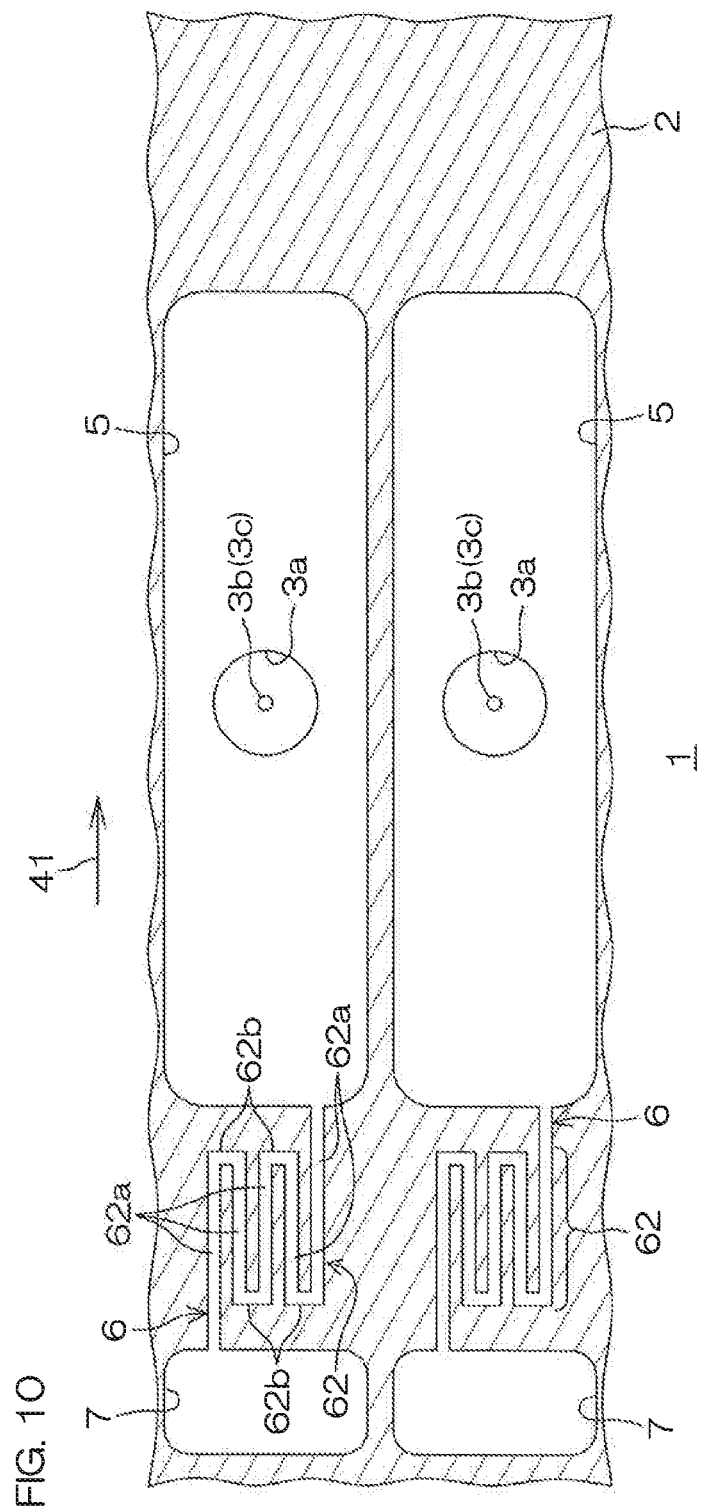

DEVICE USING A PIEZOELECTRIC ELEMENT AND METHOD FOR MANUFACTURING THE SAME

BACKGROUND OF THE INVENTION

1. Field of the Invention

The present invention relates to a device using a piezoelectric element that uses a piezoelectric element and a method for manufacturing the same.

2. Description of the Related Art

Japanese Patent Application Publication No. 2013-119182 discloses an inkjet printing head that uses a piezoelectric element. The inkjet printing head of Japanese Patent Application Publication No. 2013-119182 includes an actuator substrate having a pressure chamber (cavity), a movable film supported by the actuator substrate so as to face the pressure chamber, and a piezoelectric element bonded to the movable film. The piezoelectric element is arranged by laminating a lower electrode, a piezoelectric film, and an upper electrode in that order from the movable film side. To make the displacement of the movable film large, the piezoelectric film is not provided at a peripheral edge portion of the movable film. An entirety of an upper surface and an entirety of a side surface of the piezoelectric element are covered by a hydrogen barrier film. An insulating film (interlayer insulating film) is formed above the hydrogen barrier film.

A wiring connected to the upper electrode is formed above the insulating film. One end portion of the wiring is disposed above one end portion of the upper electrode. A contact hole, penetrating continuously through the hydrogen barrier film and the insulating film, is formed between the wiring and the upper electrode. The one end portion of the wiring enters into the contact hole and is connected to the upper electrode inside the contact hole. From above the upper electrode, the wiring crosses an outer edge of the pressure chamber and extends outside the pressure chamber.

SUMMARY OF THE INVENTION

The inventor of preferred embodiments of the present invention described and claimed in the present application conducted an extensive study and research regarding a device using a piezoelectric element and a method for manufacturing the same, such as the one described above, and in doing so, discovered and first recognized new unique challenges and previously unrecognized possibilities for improvements as described in greater detail below.

With the inkjet printing head according to Japanese Patent Application Publication No. 2013-119182, cracking due to application of stress of the wiring may occur at a region of the peripheral edge portion of the movable film above which the wiring passes.

An object of the present invention is to provide a device using a piezoelectric element and a method for manufacturing the same with which occurrence of cracking in a movable film due to stress of a wiring can be prevented.

In order to overcome the previously unrecognized and unsolved challenges described above, a device using a piezoelectric element according to the present invention includes a substrate having a cavity, a movable film formation layer including a movable film disposed above the cavity and defining a top surface portion of the cavity, and a piezoelectric element formed above the movable film. The piezoelectric element includes a lower electrode formed above the movable film, a piezoelectric film formed above the lower electrode, and an upper electrode formed above the piezoelectric film, and in a plan view of viewing from a direction normal to a major surface of the movable film, the upper electrode has a peripheral edge that is receded further toward an interior of the cavity than the movable film. The device using the piezoelectric element further includes a wiring having one end portion connected to an upper surface of the upper electrode and having another end portion led out to an outer side of a peripheral edge of the cavity in the plan view. The piezoelectric film has an active portion with an upper surface in contact with a lower surface of the upper electrode and an inactive portion extending along a lower surface of the wiring from a side portion of the active portion to an outer side of the peripheral edge of the cavity.

A portion of the movable film between the upper electrode and the peripheral edge of the cavity in a plan view shall be referred to as the peripheral edge portion of the movable film. In the present arrangement, the inactive portion of the piezoelectric film is interposed between the wiring and a region of the peripheral edge portion of the movable film directly below the wiring. A tip portion of the inactive portion of the piezoelectric film is supported by a peripheral wall of the cavity in the substrate. Stress that is generated in the wiring and applied to the movable film is thus relaxed by the inactive portion of the piezoelectric film. Cracking of the movable film due to the stress of the wiring can thereby be prevented.

In the preferred embodiment of the present invention, a thickness of the inactive portion is thinner than a thickness of the active portion. With this arrangement, lowering of displacement amount of the movable film due to the inactive portion can be suppressed in comparison to a case where the thickness of the inactive portion and the thickness of the active portion are the same.

The preferred embodiment of the present invention further includes a hydrogen barrier film, having an opening at an upper surface center of the upper electrode and covering a peripheral edge portion of the upper surface of the upper electrode, entireties of side surfaces of the upper electrode and the piezoelectric film, and an upper surface of the inactive portion of the piezoelectric film, and an insulating film, formed above the hydrogen barrier film and disposed between the hydrogen barrier film and the wiring. A contact hole, exposing a portion of the upper electrode is formed in the hydrogen barrier film and the insulating film. The one end portion of the wiring is connected to the upper electrode via the contact hole. With this arrangement, degradation of characteristics of the piezoelectric film due to hydrogen reduction can be prevented. Also with this arrangement, the hydrogen barrier film has the opening at the upper surface center of the upper electrode so that the piezoelectric film can deform readily and displacement of the movable film can be made large.

The preferred embodiment of the present invention further includes a passivation film formed above the insulating film and covering the wiring. With this arrangement, the wiring can be protected by the passivation film.

In the preferred embodiment of the present invention, the cavity is formed to a rectangular shape in the plan view. The movable film is formed to a rectangular shape matching the peripheral edge of the cavity in the plan view. Each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film. In the plan view, the wiring extends from one end portion of the upper electrode to beyond the peripheral edge of the cavity along an extension in a long direction of the upper electrode. In the plan view, the inactive portion of the piezoelectric film extends from one end portion of the active portion corresponding to the one end portion of the upper electrode to the outer side beyond the peripheral edge of the cavity of the cavity along an extension in a long direction of the active portion. With this arrangement, cracking of the movable film due to stress of the wiring can be prevented.

In the preferred embodiment of the present invention, the movable film formation layer is constituted of an $SiO_2$ single film.

In the preferred embodiment of the present invention, the movable film formation layer is constituted of a laminated film of an Si film formed above the substrate, an $SiO_2$ film formed above the Si film, and an SiN film formed above the $SiO_2$ film.

In the preferred embodiment of the present invention, the piezoelectric film is constituted of a PZT film.

In the preferred embodiment of the present invention, the upper electrode is constituted of a Pt single film.

In the preferred embodiment of the present invention, the upper electrode is constituted of a laminated film of an $IrO_2$ film formed above the piezoelectric film and an Ir film formed above the $IrO_2$ film.

In the preferred embodiment of the present invention, the lower electrode is constituted of a laminated film of a Ti film formed at the movable film side and Pt film formed above the Ti film.

A first method for manufacturing a device using a piezoelectric element according to the present invention includes a step of forming a movable film formation layer, including a movable film formation region, above a substrate, a step of forming a lower electrode film, a piezoelectric material film, and an upper electrode film successively above the movable film formation layer, a step of forming an upper electrode by patterning the upper electrode film by etching to an upper electrode pattern having, in a plan view of viewing from a direction normal to a major surface of the movable film formation layer, a peripheral edge that is receded further inwardly than a peripheral edge of the movable film formation region, a step of performing overetching by continuing the etching to thin a portion of the piezoelectric material film exposed from the upper electrode, a step of patterning the piezoelectric material film to a piezoelectric film pattern to form a piezoelectric film constituted of an active portion with an upper surface in contact with a lower surface of the upper electrode and an inactive portion extending from the active portion to an outer side of the movable film formation region and being thinner than the active portion, a step of patterning the lower electrode film to a lower electrode pattern to form a lower electrode to thereby form a piezoelectric element including the lower electrode, the upper electrode, and the active portion sandwiched therebetween, a step of forming, above the movable film formation layer, a hydrogen barrier film covering the piezoelectric element and the inactive portion, a step of forming a contact hole, exposing a portion of the upper electrode, in the hydrogen barrier film above the upper electrode, a step of forming, above the hydrogen barrier film, a wiring having one end portion contacting the upper electrode via the contact hole, a lengthwise intermediate portion passing above the inactive portion of the piezoelectric film, and another end portion being led out to an outer side of the piezoelectric element, and a step of etching the substrate from below to form a cavity facing the movable film formation region.

With the present method for manufacturing the device using the piezoelectric element, stress that is generated in the wiring and applied to the movable film is relaxed by the inactive portion of the piezoelectric film. Cracking of the movable film due to the stress of the wiring can thereby be prevented.

A second method for manufacturing a device using a piezoelectric element according to the present invention includes a step of forming a movable film formation layer, including a movable film formation region, above a substrate, a step of forming a lower electrode film, a piezoelectric material film, and an upper electrode film successively above the movable film formation layer, a step of forming an upper electrode by patterning the upper electrode film by etching to an upper electrode pattern having, in a plan view of viewing from a direction normal to a major surface of the movable film formation layer, a peripheral edge that is receded further inwardly than a peripheral edge of the movable film formation region, a step of performing overetching by continuing the etching to thin a portion of the piezoelectric material film exposed from the upper electrode, a step of patterning the piezoelectric material film to a piezoelectric film pattern to form a piezoelectric film constituted of an active portion with an upper surface in contact with a lower surface of the upper electrode and an inactive portion extending from the active portion to an outer side of the movable film formation region and being thinner than the active portion, a step of patterning the lower electrode film to a lower electrode pattern to form a lower electrode to thereby form a piezoelectric element including the lower electrode, the upper electrode, and the active portion sandwiched therebetween, a step of successively forming, above the movable film formation layer, a hydrogen barrier film and an insulating film covering the piezoelectric element and the inactive portion, a step of forming a contact hole, exposing a portion of the upper electrode, in the hydrogen barrier film and the insulating film above the upper electrode, a step of forming, above the insulating film, a wiring having one end portion contacting the upper electrode via the contact hole, a lengthwise intermediate portion passing above the inactive portion of the piezoelectric film, and another end portion being led out to an outer side of the piezoelectric element, and a step of etching the substrate from below to form a cavity facing the movable film formation region.

With the present method for manufacturing the device using the piezoelectric element, stress that is generated in the wiring and applied to the movable film is relaxed by the inactive portion of the piezoelectric film. Cracking of the movable film due to the stress of the wiring can thereby be prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is an illustrative enlarged sectional view for describing another example of restriction flow passages of the inkjet printing head.

DETAILED DESCRIPTION OF THE PREFERRED EMBODIMENTS

Preferred embodiments of the present invention shall now be described in detail with reference to the attached drawings.

Figure 1A:
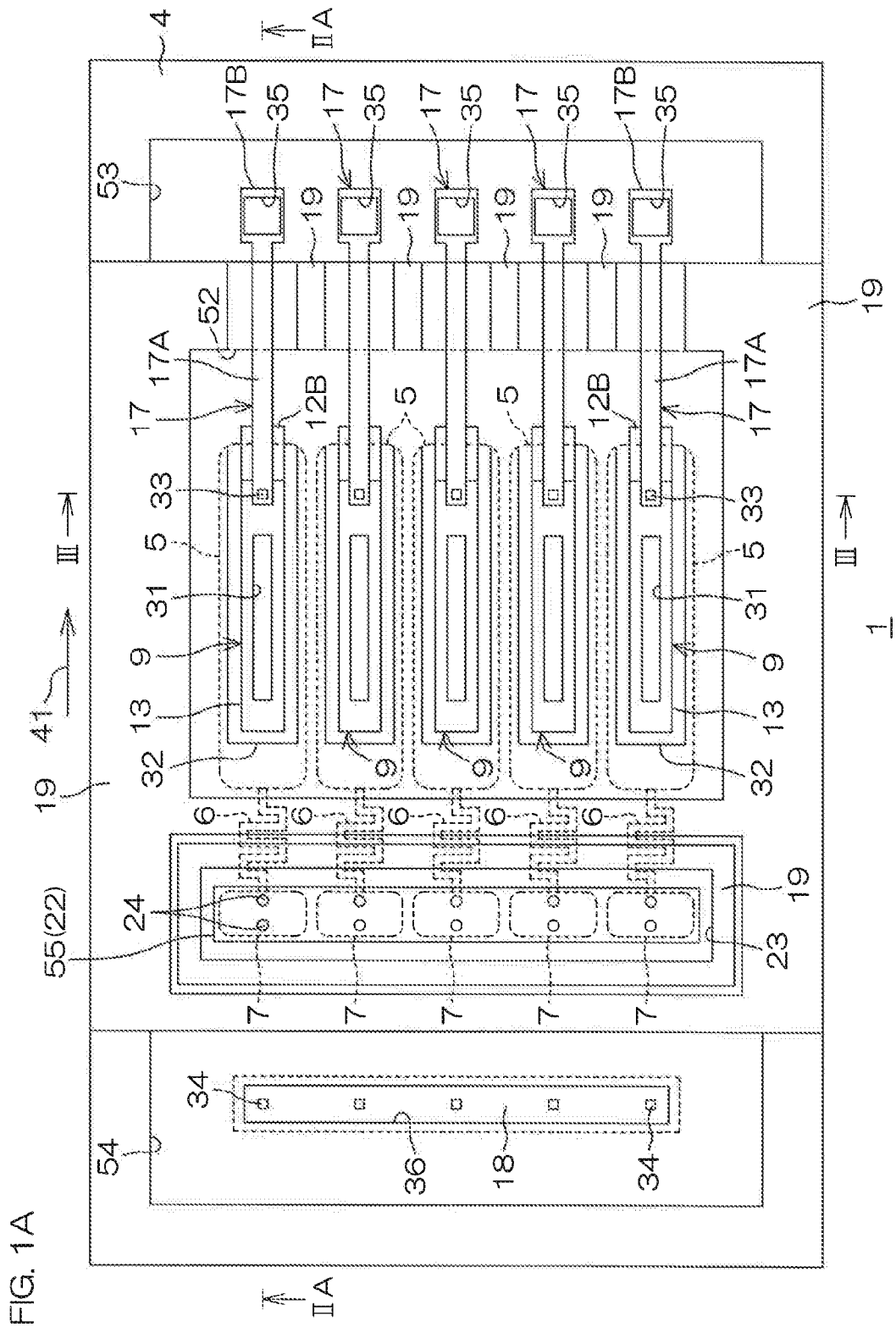
FIG. 1A is an illustrative plan view for describing the arrangement of an inkjet printing head according to a preferred embodiment of the present invention.
Figure 1B:
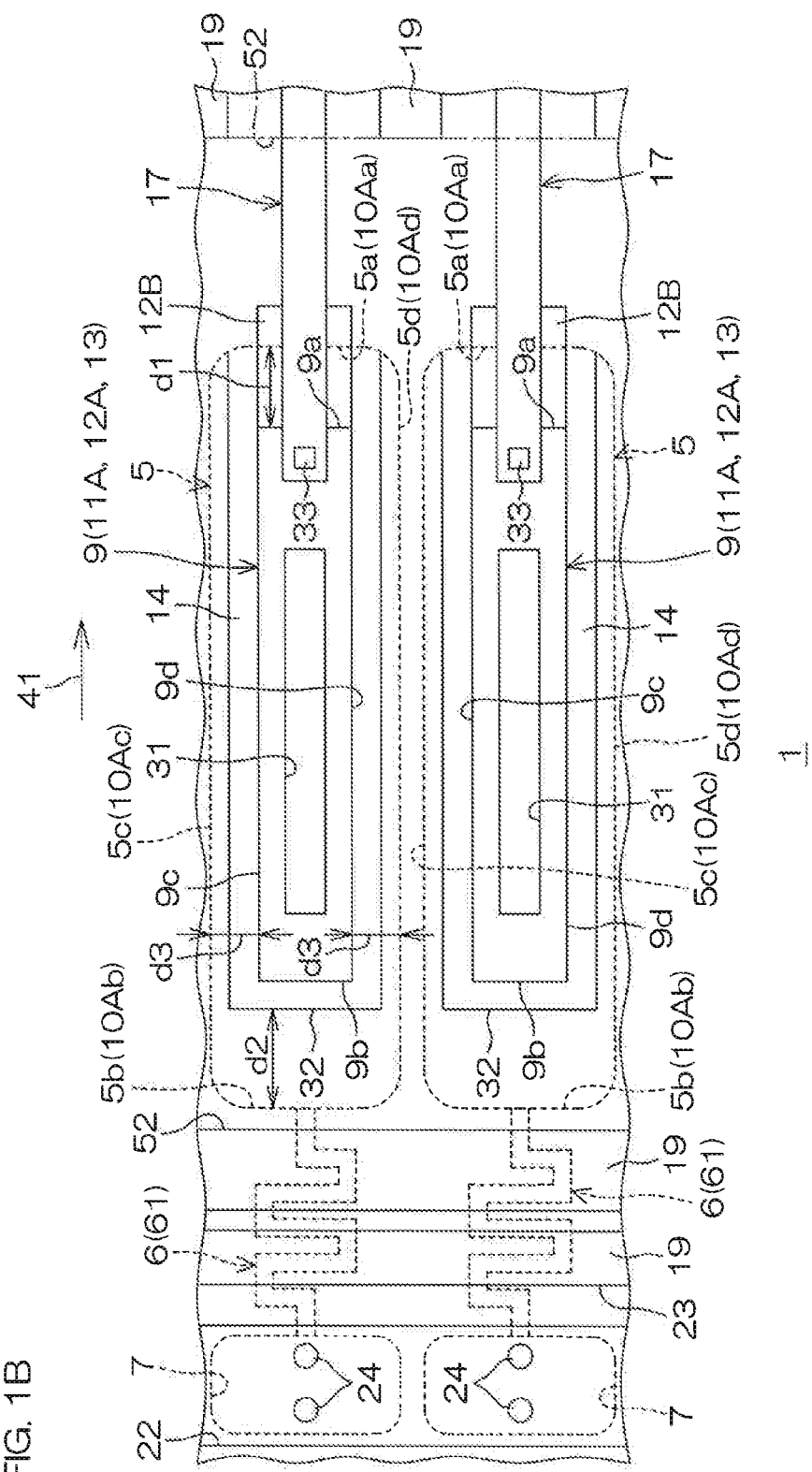
FIG. 1B is an enlarged plan view of a principal portion of FIG. 1A.
Figure 2A:
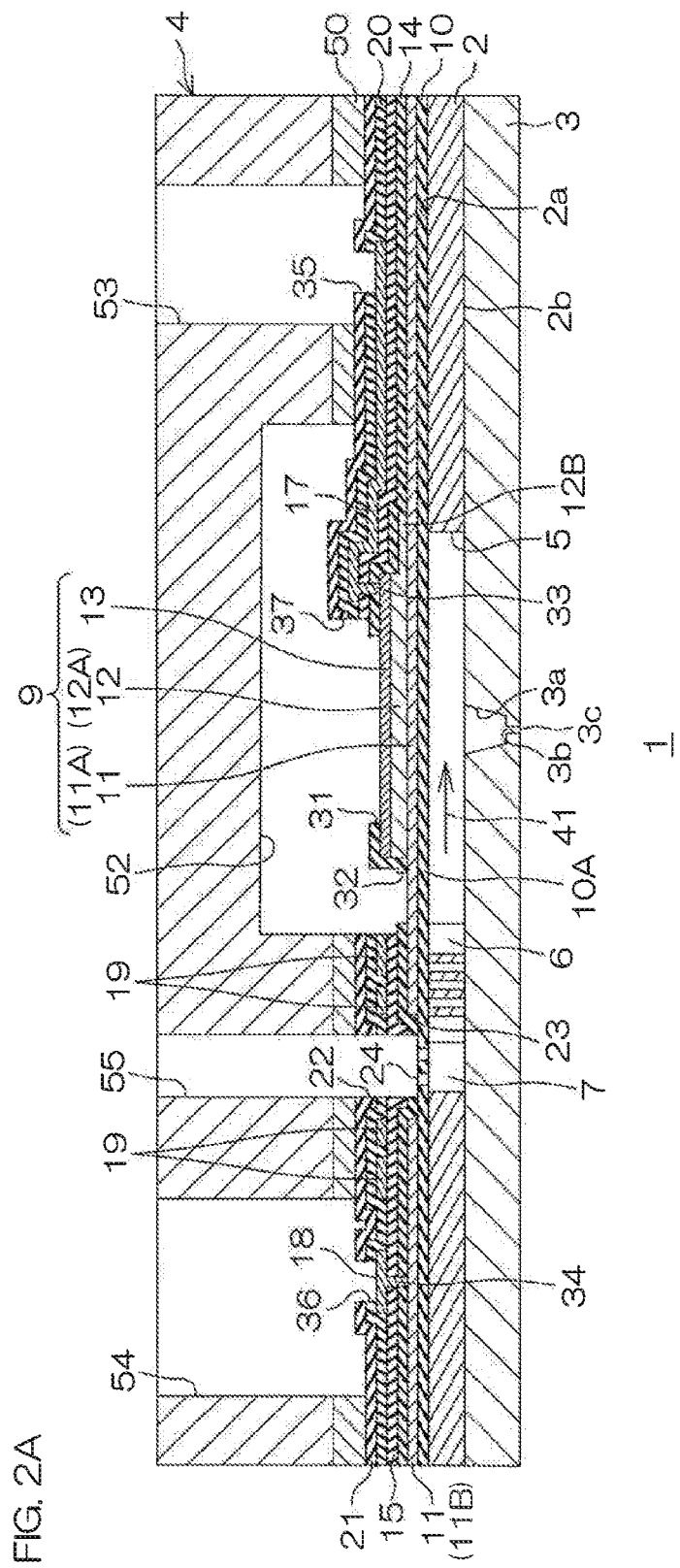
FIG. 2A is an illustrative sectional view taken along line IIA-IIA in FIG. 1A.
Figure 2B:
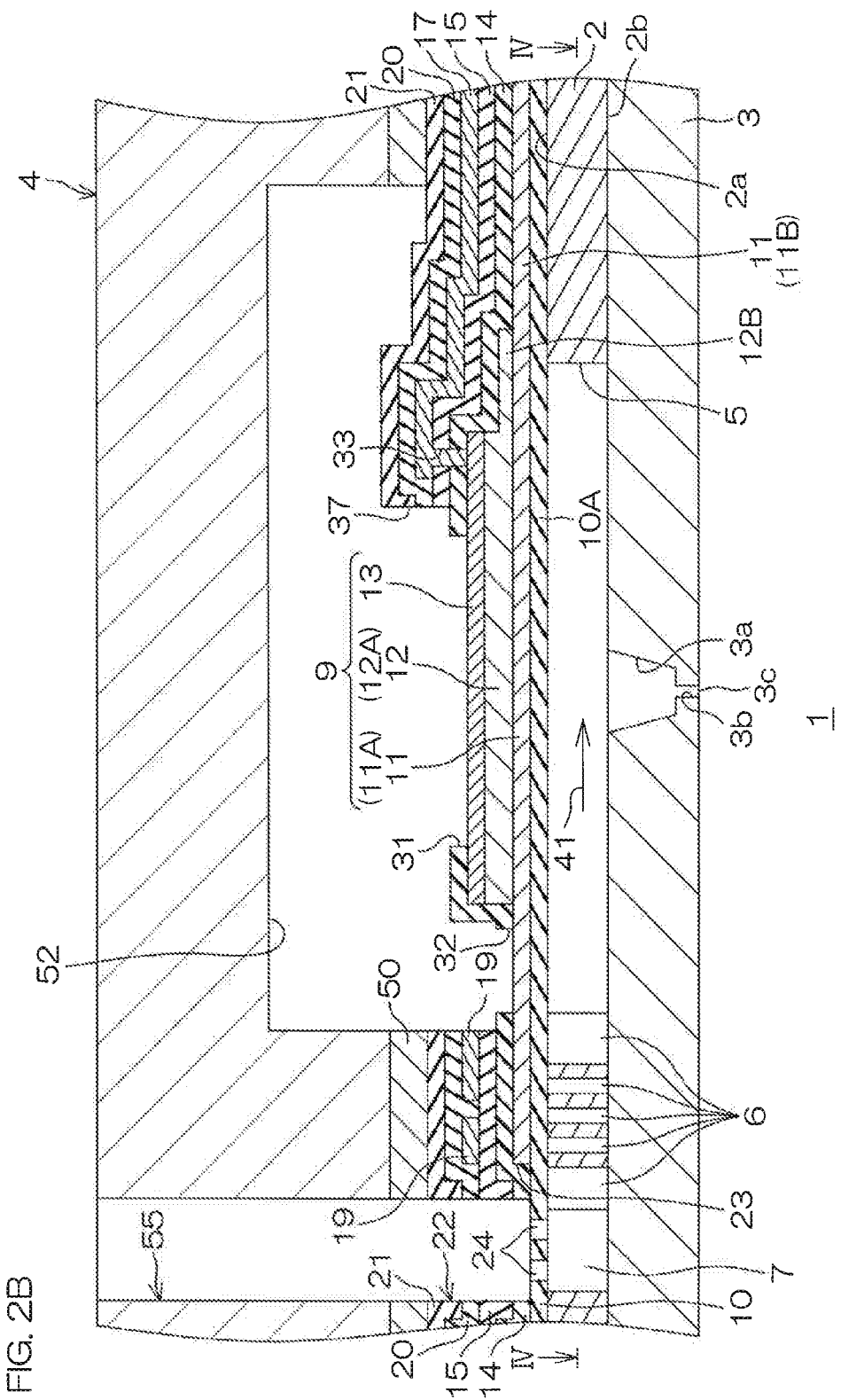
FIG. 2B is an enlarged sectional view of a principal portion of FIG. 2A.
Figure 3:
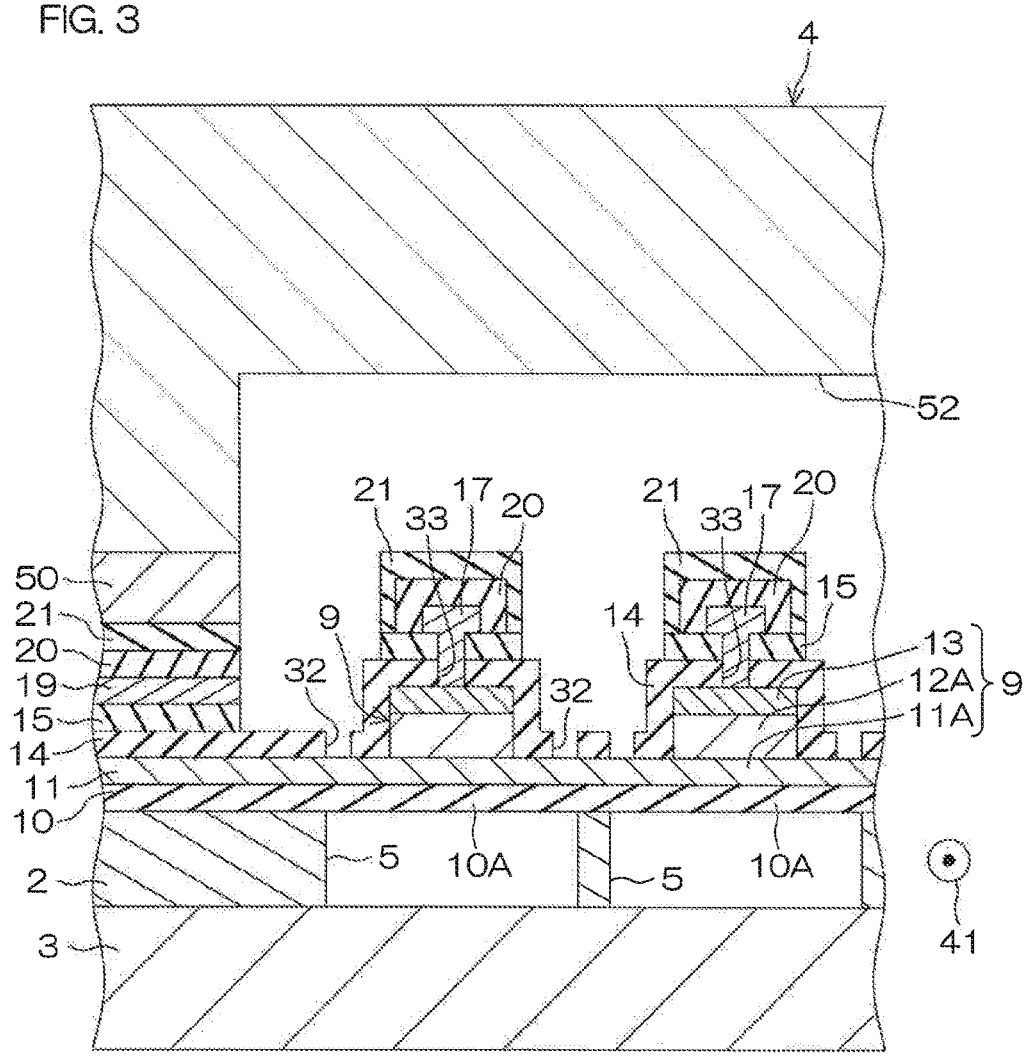
FIG. 3 is an illustrative enlarged sectional view of a portion of a section taken along line III-III in FIG. 1A.
Figure 4:
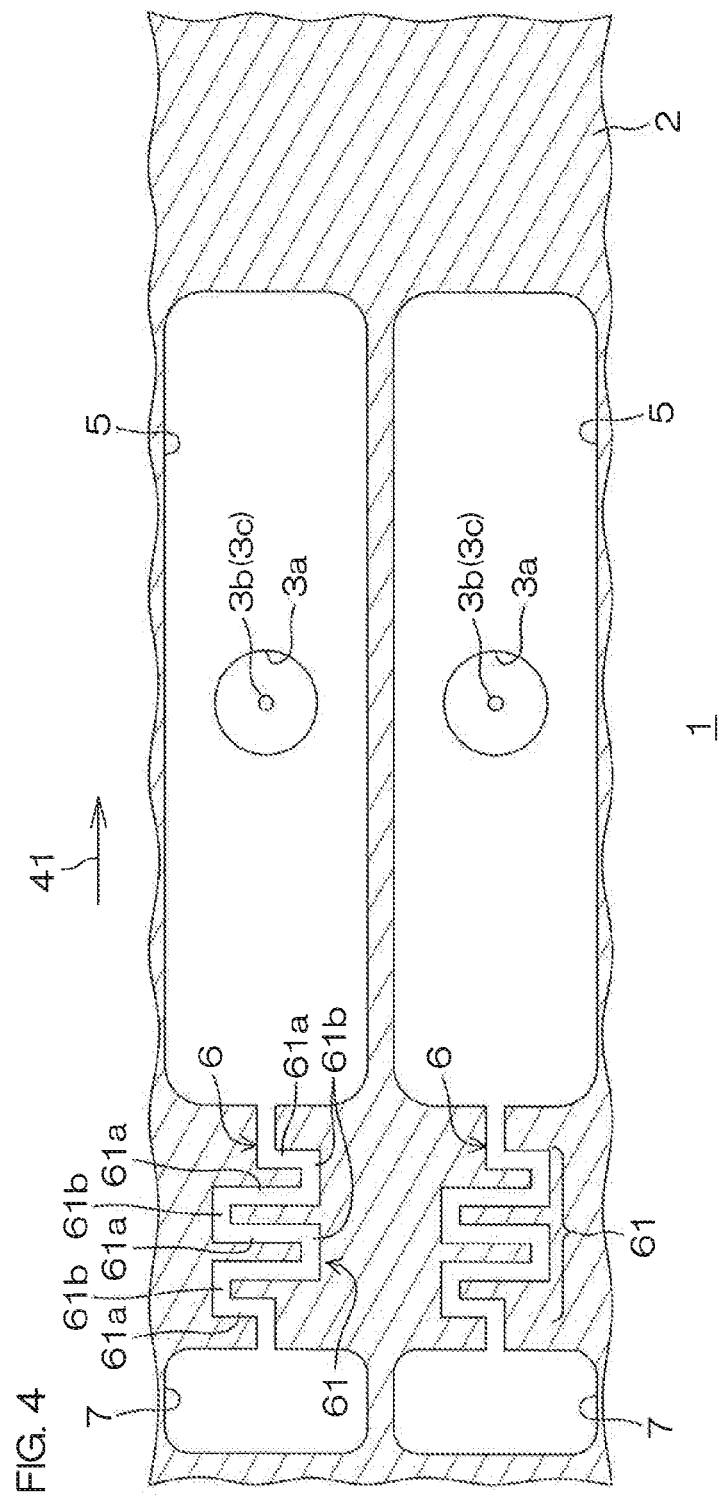
FIG. 4 is an illustrative enlarged sectional view taken along line IV-IV in FIG. 2B.
Figure 5:
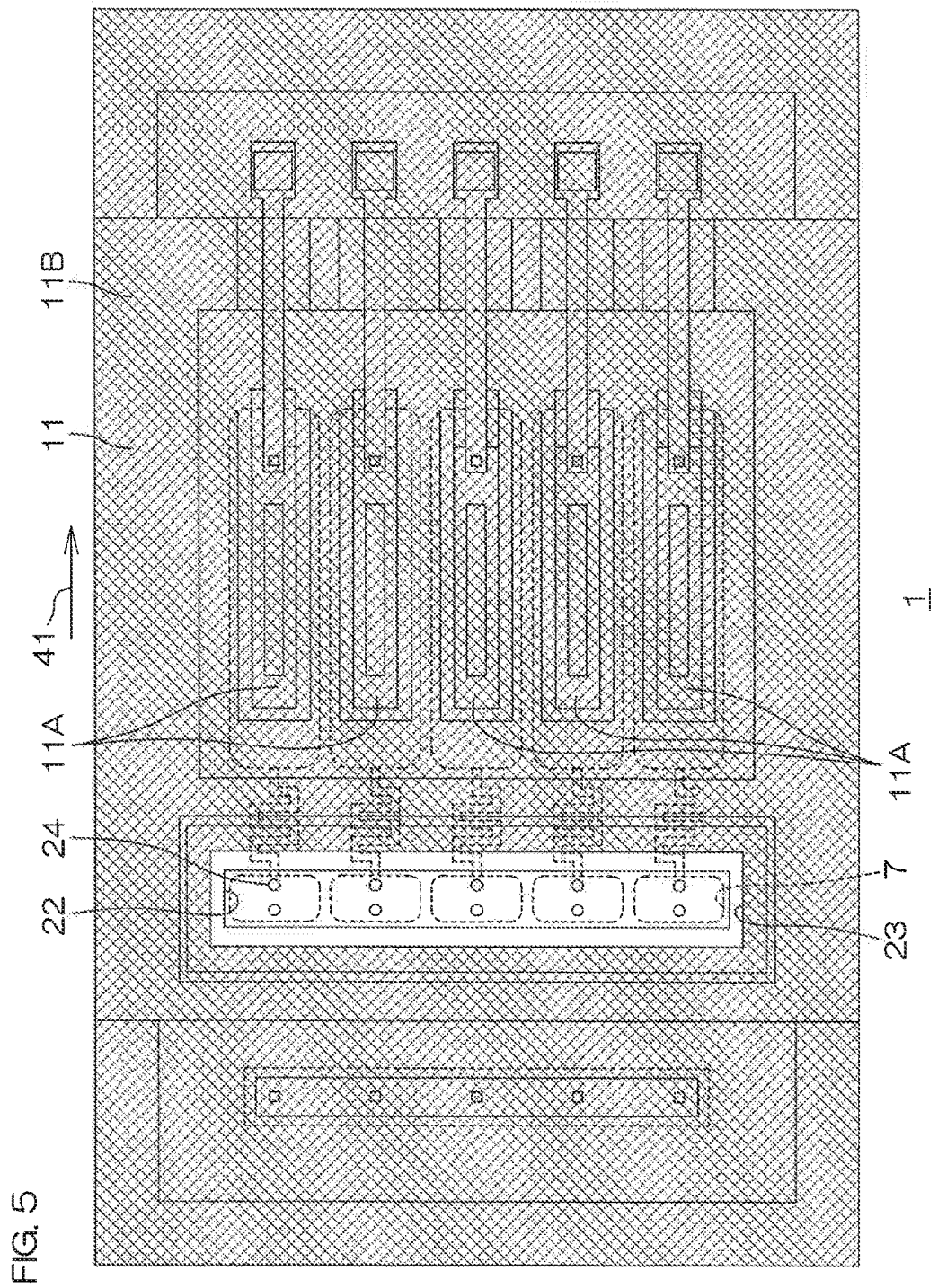
FIG. 5 is an illustrative plan view of a pattern example of a lower electrode of the inkjet printing head.

FIG. 1A is an illustrative plan view for describing the arrangement of an inkjet printing head according to a preferred embodiment of the present invention. FIG. 1B is an enlarged plan view of a principal portion of FIG. 1A. FIG. 2A is an illustrative sectional view taken along line IIA-IIA in FIG. 1A. FIG. 2B is an enlarged sectional view of a principal portion of FIG. 2A. FIG. 3 is an illustrative enlarged sectional view of a portion of a section taken along line III-III in FIG. 1A. FIG. 4 is an illustrative enlarged sectional view taken along line IV-IV in FIG. 2B. FIG. 5 is an illustrative plan view of a pattern example of a lower electrode of the inkjet printing head.

The arrangement of an inkjet printing head 1 shall now be described in outline with reference to FIG. 2A and FIG. 2B.

The inkjet printing head 1 includes an actuator substrate 2, a nozzle substrate 3, and a protective substrate 4. A movable film formation layer 10 is laminated on the front surface of the actuator substrate 2. In the actuator substrate 2, pressure chambers (cavities) 5 are formed as ink flow passages (ink reservoirs). In the present preferred embodiment, the pressure chambers 5 are formed to penetrate through the actuator substrate 2.

The nozzle substrate 3 is constituted, for example, of a silicon substrate. The nozzle substrate 3 is adhered to a rear surface 2b of the actuator substrate 2. The nozzle substrate 3, together with the actuator substrate 2 and the movable film formation layer 10, defines the pressure chambers 5. More specifically, the nozzle substrate 3 defines bottom surface portions of the pressure chambers 5. The nozzle substrate 3 has a recess 3a facing each pressure chamber 5 and an ink discharge passage 3b is formed in a bottom surface of each recess 3a. Each ink discharge passage 3b penetrates through the nozzle substrate 3 and has a discharge port 3c at an opposite side from the pressure chamber 5. Therefore, when a volume change occurs in a pressure chamber 5, the ink retained in the pressure chamber 5 passes through the ink discharge passage 3b and is discharged from the discharge port 3c.

The actuator substrate 2 further has formed therein restriction flow passages 6 in communication with the pressure chambers 5 (see also FIG. 1A, FIG. 1B, and FIG. 4) and ink inflow portions 7 in communication with the restriction flow passages 6. Each pressure chamber 5 is formed to be elongate along an ink flow direction 41, which is a right/left direction in FIG. 2A and FIG. 2B.

Each portion of the movable film formation layer 10 that is a top roof portion of a pressure chamber 5 constitutes a movable film 10A. The movable film 10A (movable film formation layer 10) is constituted, for example, of a silicon oxide ($SiO_2$) film formed above the actuator substrate 2. The movable film 10A (movable film formation layer 10) may be constituted of a laminated film, for example, of a silicon (Si) film formed above the actuator substrate 2, a silicon oxide ($SiO_2$) film formed above the silicon film, and a silicon nitride (SiN) film formed above the silicon oxide film. In the present specification, the movable film 10A refers to a top roof portion of the movable film formation layer 10 that defines the top roof portion of the pressure chamber 5. Therefore, portions of the movable film formation layer 10 besides the top roof portions of the pressure chambers 5 do not constitute the movable film 10A.

The movable film 10A has a thickness of, for example, 0.4 µm to 2 µm. If the movable film 10A is constituted of a silicon oxide film, the thickness of the silicon oxide film may be approximately 1.2 µm. If the movable film 10A is constituted of a laminated film of a silicon film, a silicon oxide film, and a silicon nitride film, the thickness of each of the silicon film, the silicon oxide film, and the silicon nitride film may be approximately 0.4 µm.

Each pressure chamber 5 is defined by the movable film 10A, the actuator substrate 2, and the nozzle substrate 3 and is formed to a substantially rectangular parallelepiped shape in the present preferred embodiment. The pressure chamber 5 may, for example, have a length of approximately 800 μm and a width of approximately 55 μm. Each restriction flow passage 6 is in communication with one end portion (an end portion at an upstream side of the ink flow direction 41 in the present preferred embodiment) in a long direction of a pressure chamber 5. Each ink inflow portion 7 is in communication with one end portion (an end portion at an upstream side of the ink flow direction 41 in the present preferred embodiment) of a restriction flow passage 6.

A piezoelectric element 9 is disposed on a front surface of each movable film 10A. Each piezoelectric element 9 includes a lower electrode 11 formed above the movable film formation layer 10, a piezoelectric film 12 formed above the lower electrode 11, and an upper electrode 13 formed above the piezoelectric film 12. In other words, the piezoelectric element 9 is arranged by sandwiching the piezoelectric film 12 from above and below by the upper electrode 13 and the lower electrode 11.

The upper electrode 13 may be a single film of platinum (Pt) or may have a laminated structure, for example, in which a conductive oxide film (for example, an $IrO_2$ (iridium oxide) film) and a metal film (for example, an Ir (iridium) film) are laminated. The upper electrode 13 may have a thickness, for example, of approximately 0.2 μm.

As the piezoelectric film 12, for example, a PZT (PbZr$_x$Ti$_{1-x}$O$_3$: lead zirconate titanate) film formed by a sol-gel method or a sputtering method may be applied. Such a piezoelectric film 12 is constituted of a sintered body of a metal oxide crystal. The piezoelectric film 12 includes an active portion 12A in contact with a lower surface of the upper electrode 13 and an inactive portion 12B extending from a portion of a peripheral wall of the active portion 12A to an outer side of a peripheral edge of the pressure chamber 5. The active portion 12A is formed to be of the same shape as the upper electrode 13 in a plan view.

The active portion 12A has a thickness of approximately 1 μm to 5 μm. The inactive portion 12B may have a thickness of approximately ½ the thickness of the active portion 12A. The overall thickness of the movable film 10A is preferably approximately the same as the thickness of the active portion 12A or approximately ⅔ the thickness of the active portion 12A.

The lower electrode 11 has, for example, a two-layer structure with a Ti (titanium) film and a Pt (platinum) film being laminated successively from the movable film formation layer 10 side. Besides this, the lower electrode 11 may be formed of a single film that is an Au (gold) film, a Cr (chromium) layer, or an Ni (nickel) layer, etc. The lower electrode 11 has a main electrode portion 11A in contact with a lower surface of the active portion 12A of the piezoelectric film 12 and an extension portion 11B extending to a region outside the active portion 12A. The lower electrode 11 may have a thickness, for example, of approximately 0.2 μm.

A first hydrogen barrier film 14 is formed above the extension portion 11B of the lower electrode 11 and above the piezoelectric element 9. The first hydrogen barrier film 14 is constituted, for example, of $Al_2O_2$ (alumina). The first hydrogen barrier film 14 has a thickness of approximately 50 nm to 100 nm. The first hydrogen barrier film 14 is provided to prevent degradation of characteristics of the piezoelectric film 12 due to hydrogen reduction.

An insulating film 15 is laminated on the first hydrogen barrier film 14. The insulating film 15 is constituted, for example, of $SiO_2$ or low-hydrogen SiN, etc. The insulating film 15 has a thickness of approximately 200 nm to 300 nm. Upper wirings 17, a lower wiring 18, and dummy wirings 19 are formed above the insulating film 15. These wirings 17, 18, and 19 may be constituted of a metal material that includes Al (aluminum). These wirings 17, 18, and 19 may have a thickness, for example, of approximately 1000 nm.

One end portion of each upper wiring 17 is disposed above one end portion of the upper electrode 13. A contact hole 33, penetrating continuously through the first hydrogen barrier film 14 and the insulating film 15, is formed between the upper wiring 17 and the upper electrode 13. The one end portion of the upper wiring 17 enters into the contact hole 33 and is connected to the upper electrode 13 inside the contact hole 33. From above the upper electrode 13, the upper wiring 17 crosses an outer edge of the pressure chamber 5 and extends outside the pressure chamber 5.

The lower wiring 18 faces the extension portion 11B of the lower electrode 11 in a region outside the pressure chamber 5. A contact hole 34, penetrating continuously through the first hydrogen barrier film 14 and the insulating film 15, is formed between the lower wiring 18 and the extension portion 11B of the lower electrode 11. The lower wiring 18 enters into the contact hole 34 and is connected to the extension portion 11B of the lower electrode 11 inside the contact hole 34.

The dummy wirings 19 are not electrically connected to either of the upper wirings 17 and the lower wiring 18 and are electrically insulated wirings.

A second hydrogen barrier film 20, covering the wirings 17, 18, and 19 and the insulating film 15, is formed above the insulating film 15. The second hydrogen barrier film 20 is constituted, for example, of $Al_2O_3$ (alumina). The second hydrogen barrier film 20 may be arranged from SiTaOx, SiZrOx, etc. The second hydrogen barrier film 20 may be formed by a sputtering method or an ALD (atomic layer deposition) method. The second hydrogen barrier film 20 has a thickness of approximately 50 nm to 100 nm.

A passivation film 21 is formed above the second hydrogen barrier film 20. As shall be described in detail below, the second hydrogen barrier film 20 is provided to prevent degradation of characteristics of the piezoelectric film 12 due to hydrogen reduction during a process of forming the passivation film 21. The passivation film 21 is constituted, for example, of SiN (silicon nitride). The passivation film 21 may have a thickness, for example, of approximately 850 nm.

Pad openings 35 and 36 that expose portions of the upper wirings 17 and the lower wiring 18 as pads are formed in the second hydrogen barrier film 20 and the passivation film 21. Each pad opening 35 is formed in a region outside the pressure chambers 5 and is formed, for example, at a tip portion (end portion at an opposite side from the portion of contact with the upper electrode 13) of an upper wiring 17.

An ink supply passage 22, penetrating through the passivation film 21, the second hydrogen barrier film 20, the insulating film 15, the first hydrogen barrier film 14, and the lower electrode 11, is formed at a position corresponding to the ink inflow portion 7. A penetrating hole 23 that includes the ink supply passage 22 and is larger than the ink supply passage 22 is formed in the lower electrode 11. The first hydrogen barrier film 14 enters into a gap between the penetrating hole 23 in the lower electrode 11 and the ink supply passage 22. Between the ink supply passage 22 and the ink inflow portion 7, ink flow-through holes 24 are formed in the movable film formation layer 10. The ink supply passage 22 and the ink inflow portion 7 are put in communication via the ink flow-through holes 24.

The protective substrate 4 is constituted, for example, of a silicon substrate. The protective substrate 4 is disposed above the actuator substrate 2 so as to cover the piezoelectric element 9. The protective substrate 4 is bonded to the passivation film 21, via an adhesive agent 50. The protective substrate 4 has a housing recess 52 in a facing surface 51 that faces a front surface 2a of the actuator substrate 2. The piezoelectric elements 9 are housed inside the housing recess 52. Further, the protective substrate 4 has formed therein a wiring penetrating hole 53 exposing the pads of the upper wirings 17 and a wiring penetrating hole 54 exposing the pad of the lower wiring 18.

An ink tank (not shown) storing ink is disposed above the protective substrate 4. In the protective substrate 4, an ink supply passage 55, in communication with the ink supply passage 22, is formed between the housing recess 52 and the wiring penetrating hole 54. The ink supply passage 55 penetrates through the protective substrate 4.

Each piezoelectric element 9 is formed at a position facing the pressure chamber 5 across the movable film 10A. That is, the piezoelectric element 9 is formed to contact a surface of the movable film 10A at the opposite side from the pressure chamber 5. The pressure chamber 5 is filled with ink by the ink being supplied from the ink tank to the pressure chamber 5 through the ink supply passage 55, the ink supply passage 22, the ink flow-through holes 24, the ink inflow portion 7 and the restriction flow passage 6. The movable film 10A defines a top surface portion of the pressure chamber 5 and faces the pressure chamber 5. The movable film 10A is supported by portions of the actuator substrate 2 at a periphery of the pressure chamber 5 and has flexibility enabling deformation in a direction facing the pressure chamber 5 (in other words, in the thickness direction of the movable film 10A).

The upper wirings 17 and the lower wiring 18 are connected to a drive circuit (not shown). Specifically, the pads of the upper wirings 17 and the drive circuit are connected via a connecting metal member (not shown) passing through the wiring penetrating hole 53 in the protective substrate 4. Similarly, the pad of the lower wiring 18 and the drive circuit are connected via a connecting metal member (not shown) passing through the wiring penetrating hole 54 in the protective substrate 4. When a drive voltage is applied from the drive circuit to the piezoelectric element 9, the piezoelectric film 12 deforms due to an inverse piezoelectric effect. The movable film 10A is thereby made to deform together with the piezoelectric element 9 to bring about a volume change of the pressure chamber 5 and the ink inside the pressure chamber 5 is pressurized. The pressurized ink passes through an ink discharge passage 3b and is discharged as microdroplets from a discharge port 3c.

The arrangement of the inkjet printing head 1 shall now be described in more detail with reference to FIG. 1A to FIG. 5.

A plurality of the pressure chambers 5 are formed as stripes extending parallel to each other in the actuator substrate 2. The restriction flow passage 6 and the ink inflow portion 7 are provided respectively for each of the plurality of pressure chambers 5. The piezoelectric element 9 is disposed respectively in each of the plurality of pressure chambers 5. The plurality of pressure chambers 5 are formed at equal intervals that are minute intervals (for example, of approximately 30 μm to 350 μm) in a width direction thereof. In a plan view, each pressure chamber 5 has an oblong shape that is elongate along the ink flow direction 41 from the restriction flow passages 6 to the discharge passage 3b. That is, the top surface portion of the pressure chamber 5 has two side edges 5c and 5d along the ink flow direction 41 and two end edges 5a and 5b along a direction orthogonal to the ink flow direction 41 (see FIG. 1B).

The restriction flow passage 6 is a flow passage of high liquid resistance that is formed between the ink inflow portion 7 and the pressure chamber 5. The restriction flow passage 6 is formed to prevent the ink inside the pressure chamber 5 from flowing toward the ink inflow portion 7 from the pressure chamber 5 when the ink inside the pressure chamber 5 is pressurized. As shown in FIG. 4, the restriction flow passage 6 includes a meandering flow passage 61 that is formed in a meandering configuration in a plan view. In a plan view, the meandering flow passage 61 includes a plurality of rectilinear portions 61a that are disposed parallel to each other at intervals in the ink flow direction 41 and connecting portions 61b each connecting end portions of adjacent rectilinear portions 61a so as to join the rectilinear portions 61a to form a single flow passage. One end of the meandering flow passage 61 is connected to the pressure chamber 5 and another end of the meandering flow passage 61 is connected to the ink inflow portion 7. In the present preferred embodiment, a depth of the restriction flow passage 6 is the same as a depth of the pressure chamber 5. The depth of the restriction flow passage 6 may be shallower than that of the pressure chamber 5.

The restriction flow passage 6 includes the meandering flow passage 61 and therefore a fluid resistance of the entire restriction flow passage with respect to a length of a restriction flow passage formation region (length between the ink inflow portion 7 and the pressure chamber 5) can be increased in comparison to a rectilinear restriction flow passage described in Japanese Patent Application Publication No. 2013-215930. The length of the restriction flow passage formation region can thereby be shortened. The inkjet printing head can thereby be reduced in size.

The ink supply passage 22 has, in a plan view, the shape of a rectangle that extends across the plurality of ink inflow portions 7 in the direction orthogonal to the ink flow direction 41 (see especially FIG. 1A). The ink supply passage 22 is a common ink supply passage used in common for the plurality of ink inflow portions 7. The ink supply passage 22 is put in communication with the plurality of ink inflow portions 7 via the ink flow-through holes 24 formed in the movable film formation layer 10.

Each piezoelectric element 9 has a rectangular shape in a plan view with which a length in the ink flow direction 41 is defined to be shorter than a length in the long direction of the movable film 10A. As shown in FIG. 1B, respective end edges 9a and 9b along a short direction of the piezoelectric element 9 are disposed at inner sides at predetermined intervals d1 and d2 respectively from respective corresponding end edges 10Aa and 10Ab of the movable film 10A (top surface portion of the pressure chamber 5). Also, a width of the piezoelectric element 9 in the short direction is defined to be narrower than a width of the movable film 10A in the short direction. Respective side edges 9c and 9d along a long direction of the piezoelectric element 9 are disposed at inner sides at predetermined intervals d3 from respective corresponding side edges 10Ac and 10Ad of the movable film 10A.

The lower electrode 11 is formed on substantially an entirety of the front surface of the movable film formation layer 10 (see especially FIG. 5). The lower electrode 11 is a common electrode used in common for the plurality of piezoelectric elements 9. The lower electrode 11 includes main electrode portions 11A of rectangular shape in a plan view that constitute the piezoelectric elements 9 and an extension portion 11B led out from the main electrode portions 11A in a direction along the front surface of the movable film formation layer 10 to extend outside the peripheral edges of the top surface portions of the pressure chambers 5.

Each main electrode portion 11A is formed to be shorter than the movable film 10A in the long direction of the movable film 10A. As shown in FIG. 1B, respective end edges of the main electrode portion 11A are disposed at inner sides at the predetermined intervals d1 and d2 respectively from the respective corresponding end edges 10Aa and 10Ab of the movable film 10A. Also, a width of the main electrode portion 11A along the short direction of the movable film 10A is defined to be narrower than the width of the movable film 10A in the short direction. Respective side edges of the main electrode portion 10A are disposed at inner sides at the intervals d3 from the respective corresponding side edges 10Ac and 10Ad of the movable film 10A. The penetrating hole 23 formed in the extension portion 11B has, in a plan view, a rectangular shape that is larger than the ink flow passage 22. A peripheral edge portion of the penetrating hole 23 in the extension portion 11B surrounds the ink flow passage 22 in a plan view.

In a plan view, each upper electrode 13 is formed to a rectangular shape of the same pattern as the main electrode portion 11A of the lower electrode 11. That is, the upper electrode 13 is formed to be shorter than the movable film 10A along the long direction of the movable film 10A. As shown in FIG. 1B, respective end edges of the upper electrode 13 are disposed at inner sides at the predetermined intervals d1 and d2 respectively from the respective corresponding end edges 10Aa and 10Ab of the movable film 10A. Also, a width of the upper electrode 13 along the short direction of the movable film 10A is defined to be narrower than the width of the movable film 10A in the short direction. Respective side edges of the upper electrode 13 are disposed at inner sides at the intervals d3 from the respective corresponding side edges 10Ac and 10Ad of the movable film 10A.

As mentioned above, each piezoelectric film 12 includes the active portion 12A and the inactive portion 12B. In a plan view, the active portion 12A is formed to a rectangular shape of the same pattern as the upper electrode 13. That is, the active portion 12A is formed to be shorter than the movable film 10A along the long direction of the movable film 10A. As shown in FIG. 1B, respective end edges of the active portion 12A are disposed at inner sides at the predetermined intervals d1 and d2 respectively from the respective corresponding end edges 10Aa and 10Ab of the movable film 10A. Also, a width of the active portion 12A along the short direction of the movable film 10A is defined to be narrower than the width of the movable film 10A in the short direction. Respective side edges of the active portion 12A are disposed at inner sides at the intervals d3 from the respective corresponding side edges 10Ac and 10Ad of the movable film 10A. A lower surface of the active portion 12A contacts an upper surface of the main electrode portion 11A of the lower electrode 11 and an upper surface of the active portion 12A contacts a lower surface of the upper electrode 13.

In a plan view, the inactive portion 12B extends along the lower surface of the upper wiring 17 from a downstream side end of the active portion 12A in the ink flow direction 41 to outside the end edge 5a of the pressure chamber 5. In the present preferred embodiment, a width of the inactive portion 12B is substantially equal to the width of the active portion 12A. In the present preferred embodiment, the thickness of the inactive portion 12B is approximately ½ that of the active portion 12A. A tip portion of the inactive portion 12B outside the end edge 5a of the pressure chamber 5 is supported by the actuator substrate 2. A lower surface of the inactive portion 12B contacts an upper surface of the extension portion 11B of the lower electrode 11. An upper surface of the inactive portion 12B is covered by the first hydrogen barrier film 14.

The upper wiring 17 that is constituted of metal expands and contracts to generate stress. The inactive portion 12B is provided to prevent occurrence of cracking in the movable film 10A due to the stress of the upper wiring 17. This point shall now be described in more detail. To make a displacement amount of the movable film 10A large, the piezoelectric element 9 is not provided at a peripheral edge portion of the movable film 10A. Cracking due to application of the stress of the upper wiring 17 may occur in a region of the peripheral edge portion of the movable film 10A above which the upper wiring 17 passes.

In the present preferred embodiment, the inactive portion 12B of the piezoelectric film 12 is interposed between the upper wiring 17 and a region of the peripheral edge portion of the movable film 10A directly below the upper wiring 17. The tip portion of the inactive portion 12B of the piezoelectric film 12 is supported by a peripheral wall of the pressure chamber 5 in the actuator substrate 2. The stress that is generated in the upper wiring 17 and applied to the movable film 10A is thus relaxed by the inactive portion 12B of the piezoelectric film 12. Cracking of the movable film 10A due to the stress of the upper wiring 17 can thereby be prevented.

Each upper wiring 17 is constituted of a lead-out portion 17A, having one end portion connected to one end portion (an end portion at one end edge 9a side of the piezoelectric element 9) of the upper electrode 13 and extending along the ink flow direction 41 in a plan view, and a pad portion 17B of rectangular shape in a plan view that is made integral to the lead-out portion 17A and connected to a tip of the lead-out portion 17A. The pad portion 17B is disposed further outside than the end edge 5a at one side of the pressure chamber 5. From the upper surface of the one end portion of the piezoelectric element 9, the lead-out portion 17A extends along an end surface of the piezoelectric element 9 continuous to the upper surface and further extends to the pad portion 17B along front surfaces of the inactive portion 12B of the piezoelectric film 12 and the lower electrode 11. The pad opening 35 that exposes a central portion of a front surface of the pad portion 17B is formed in the passivation film 21.

The lower wiring 18 has, in a plan view, a rectangular shape that is long in the direction orthogonal to the ink flow direction 41. In the present preferred embodiment, one contact hole 34 is formed on an extension of each pressure chamber 5. The lower wiring 18 enters into the plurality of contact holes 34 and is connected to the extension portion 11B of the lower electrode 11 inside each contact hole 34.

The housing recess 52 of the protective substrate 4 has, in a plan view, a rectangular shape extending across the plurality of pressure chambers 5 in the direction orthogonal to the ink flow direction 41. The plurality of piezoelectric elements 9, respectively corresponding to the plurality of pressure chambers 5, are housed in the housing recess 52. The wiring penetrating hole 53 in the protective substrate 4 has, in a plan view, a rectangular shape extending across the plurality of pad portions 17B in the direction orthogonal to the ink flow direction 41. In the wiring penetrating hole 53, the plurality of pad portions 17B are exposed via the pad openings 35. The wiring penetrating hole 54 in the protective substrate 4 has, in a plan view, a rectangular shape extending along the lower wiring 18. In the wiring penetrating hole 54, the lower wiring 18 is exposed via the pad opening 36. The ink supply passage 55 in the protective substrate 4 has, in a plan view, a rectangular shape of the same pattern as the ink supply passage 22 at the actuator substrate 2 side. The ink supply passage 55 is matched with the ink supply passage 22 in a plan view.

In the present preferred embodiment, the dummy wirings 19 are formed in a predetermined pattern in a plan view in a region (hereinafter referred to as the "dummy wiring region") within a region, between a virtual line along a side edge of the wiring penetrating hole 53 at the piezoelectric element 9 side and a virtual line along a side edge of the wiring penetrating hole 54 at the piezoelectric element 9 side, that excludes the housing recess 52 and the ink supply passage 22. The dummy wirings 19 include a rectangular annular wiring that surrounds the ink supply passage 22 in a plan view. The rectangular annular wiring has inner peripheral edges at positions separated by just a fixed distance from the ink supply passage 22. A dummy wiring 19 is further formed in a region, within the dummy wiring region outside the rectangular annular wiring, that excludes a vicinity region of a periphery of the rectangular annular wiring and the upper wirings 17 plus vicinity regions thereof.

Figure 6:
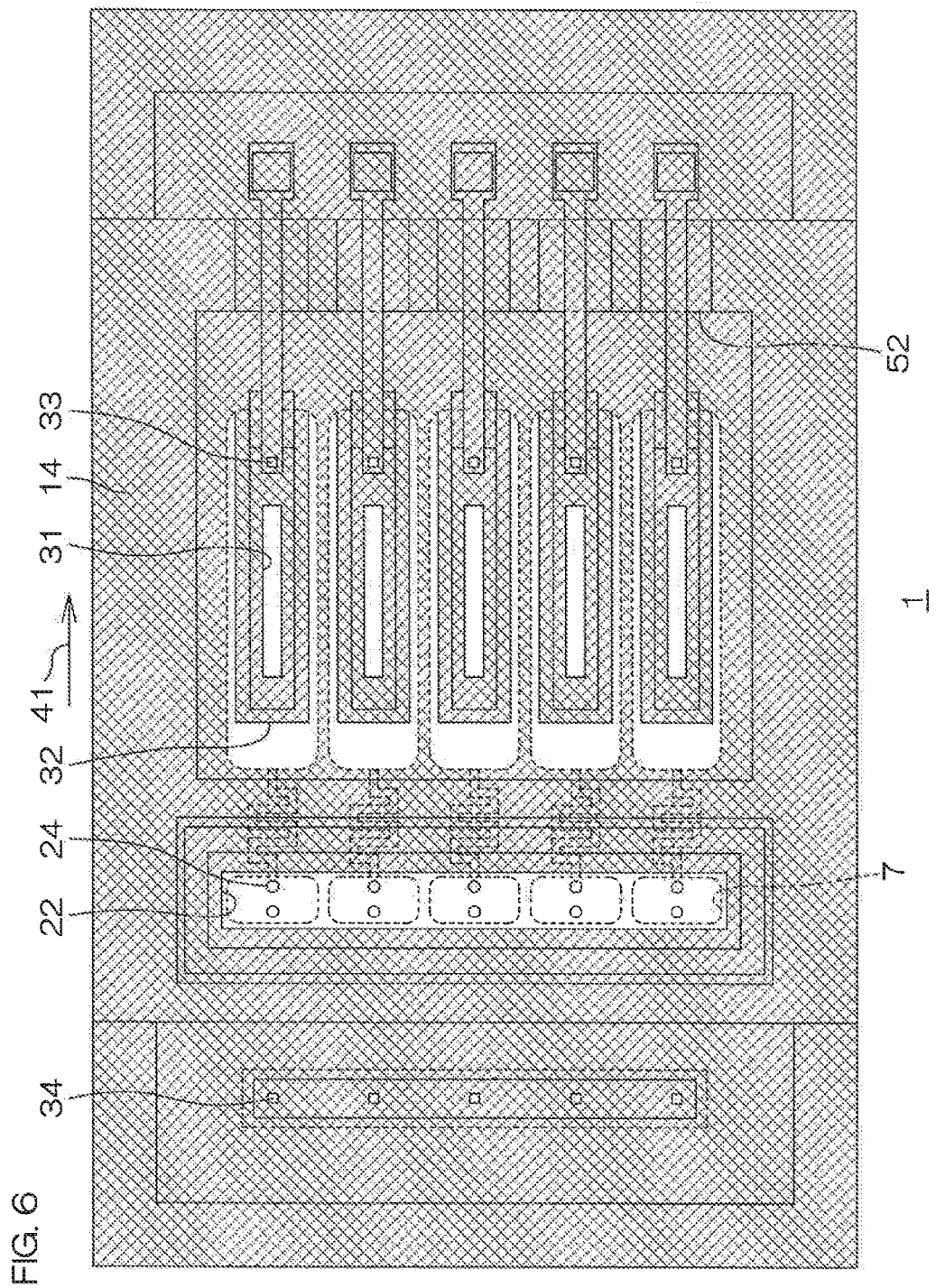
FIG. 6 is an illustrative plan view of a pattern example of a first hydrogen barrier film of the inkjet printing head.

FIG. 6 is an illustrative plan view of a pattern example of the first hydrogen barrier film 14.

In the present preferred embodiment, the first hydrogen barrier film 14 is formed above the actuator substrate 2 and on substantially an entirety of a region outside the respective pressure chambers 5 in a plan view. However, in this region, the ink supply passage 22 and the contact holes 34 are formed in the first hydrogen barrier film 14.

In a region inside each pressure chamber 5, the first hydrogen barrier film 14 is formed on the entireties of side surfaces of the piezoelectric film 12 and the upper electrode 13, on the upper surface of the inactive portion 12B of the piezoelectric film 12, and on an upper surface peripheral edge portion of the upper electrode 13. That is, an opening 31 that is rectangular in a plan view is formed in the first hydrogen barrier film 14 at an upper surface central portion of the upper electrode 13. In other words, the first hydrogen barrier film 14 is not formed at the upper surface central portion of the upper electrode 13.

Also in the first hydrogen barrier film 14, a truncated ring shaped opening 32 is formed in each region between the peripheral edge of the pressure chamber 5 and the first hydrogen barrier film 14 formed on the side surface of the piezoelectric film 12 in a plan view. In other words, in a plan view, a region in which the first hydrogen barrier film 14 is not formed is present between the peripheral edge of the pressure chamber 5 and the first hydrogen barrier film 14 formed on the side surface of the piezoelectric film 12.

Figure 7:
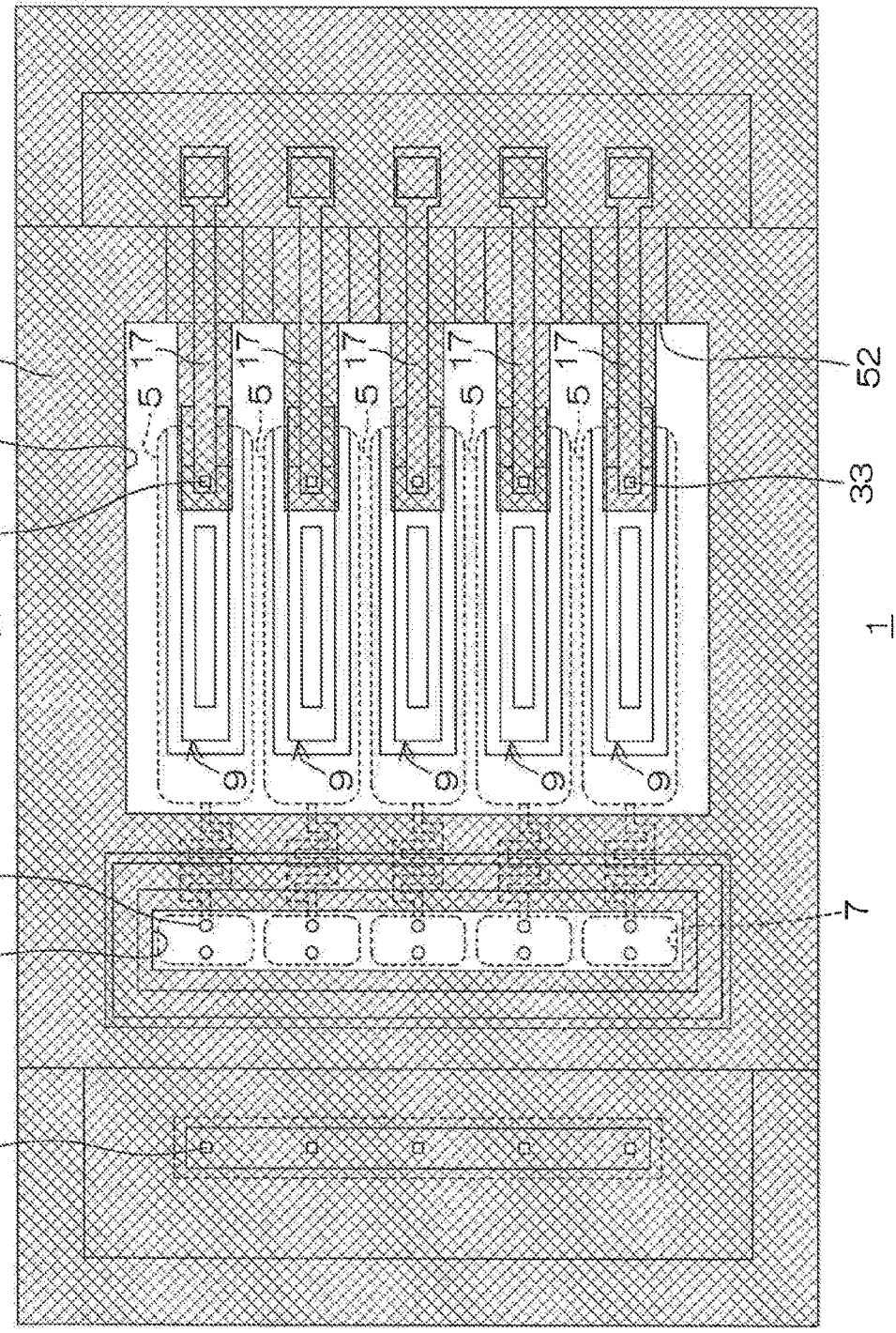
FIG. 7 is an illustrative plan view of a pattern example of an interlayer insulating film of the inkjet printing head.
Figure 8:
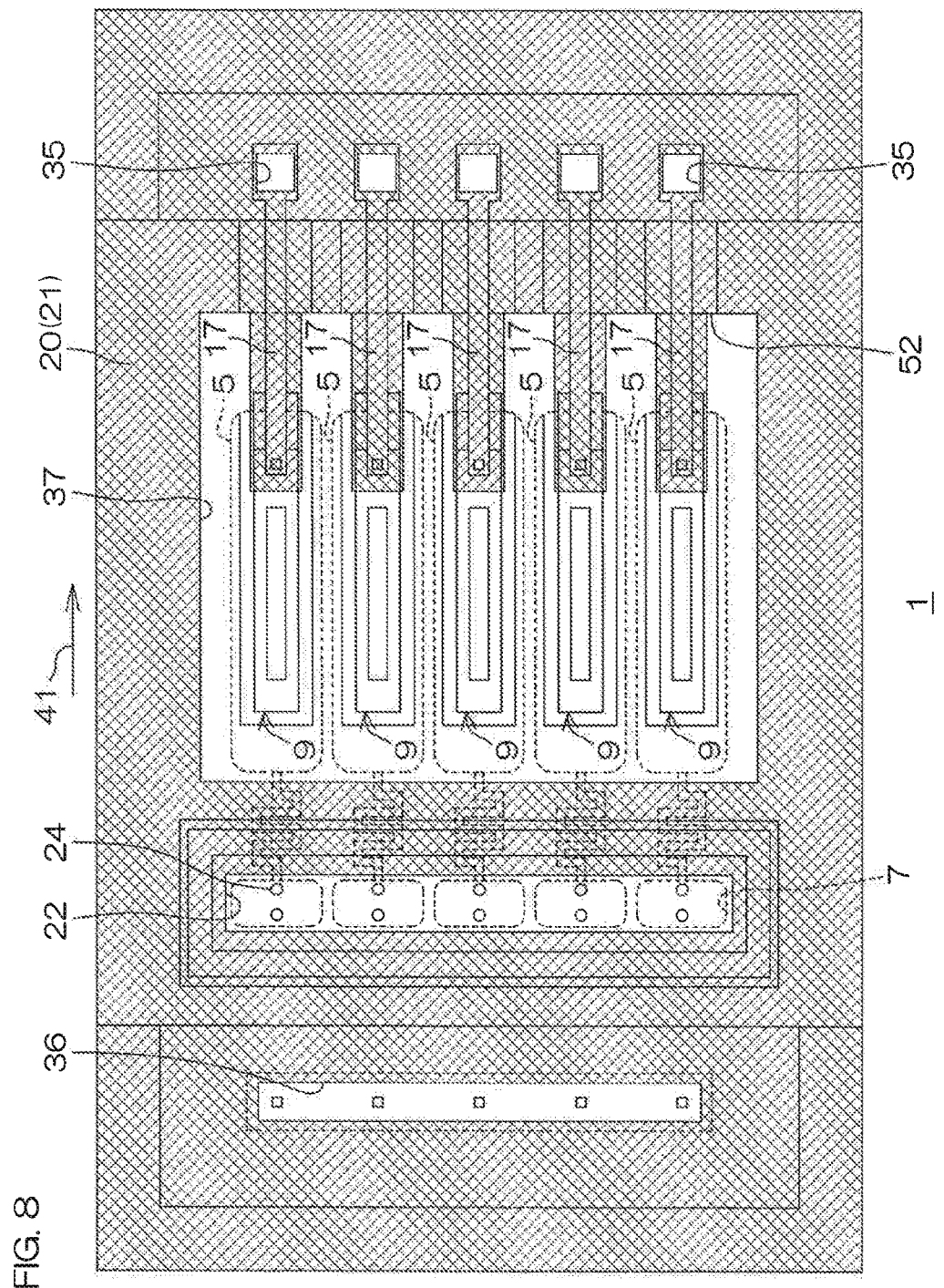
FIG. 8 is an illustrative plan view of a pattern example of a second hydrogen barrier film and a passivation film of the inkjet printing head.

FIG. 7 is an illustrative plan view of a pattern example of the insulating film 15. FIG. 8 is an illustrative plan view of a pattern example of the second hydrogen barrier film 20 and the passivation film 21.

In the present preferred embodiment, the insulating film 15, the second hydrogen barrier film 20, and the passivation film 21 are formed on substantially an entirety of a region outside the housing recess 52 of the protective substrate 4 in a plan view above the actuator substrate 2. However, in this region, the ink supply passage 22 and the contact holes 34 are formed in the insulating film 15. In this region, the ink supply passage 22 and the pad openings 35 and 36 are formed in the second hydrogen barrier film 20 and the passivation film 21.

In a region inside the housing recess 52 of the protective substrate 4, the insulating film 15, the second hydrogen barrier film 20, and the passivation film 21 are formed only in upper wiring regions in which the upper wirings 17 are present. In each of these regions, the second hydrogen barrier film 20 and the passivation film 21 are formed to cover an upper surface and a side surface of the upper wiring 17 on the insulating film 15. In other words, in the insulating film 15, the second hydrogen barrier film 20, and the passivation film 21, an opening 37 is formed in a region, within the inner side region of the housing recess 52 in a plan view, that excludes the upper wiring regions. The contact holes 33 are further formed in the insulating film 15.

In the present preferred embodiment, in each region at the inner side of the peripheral edge of the pressure chamber 5 in a plan view, the insulating film 15, the second hydrogen barrier film 20, and the passivation film 21 are formed only in the upper wiring region in which the upper wiring 17 is present. Therefore, most of the side surface and the upper surface of each piezoelectric element 9 are not covered by the insulating film 15, the second hydrogen barrier film 20, and the passivation film 21. Displacement of the movable film 10A can thereby be increased in comparison to the conventional example described in Japanese Patent Application Publication No. 2013-119182 in which the entireties of the side surface and the upper surface of the piezoelectric element 9 are covered by the insulating film and the passivation film.

Further, in the present preferred embodiment, the opening 31 is formed in the first hydrogen barrier film 14 at the upper surface central portion of each piezoelectric element 9. The piezoelectric film 12 is thereby made to deform readily and the displacement of the movable film 10A can thus be increased in comparison to the conventional example described in Japanese Patent Application Publication No. 2013-119182 in which the entirety of the upper surface of the piezoelectric element 9 is covered by the hydrogen barrier film and the insulating film. Further, in the present preferred embodiment, the truncated ring shaped opening 32 is formed in the first hydrogen barrier film 14 in each region between the peripheral edge of the pressure chamber 5 and the first hydrogen barrier film 14 formed on the side surface of the piezoelectric film 12 in a plan view. The displacement of the movable film 10A can thereby be increased further.

Figure 9A:
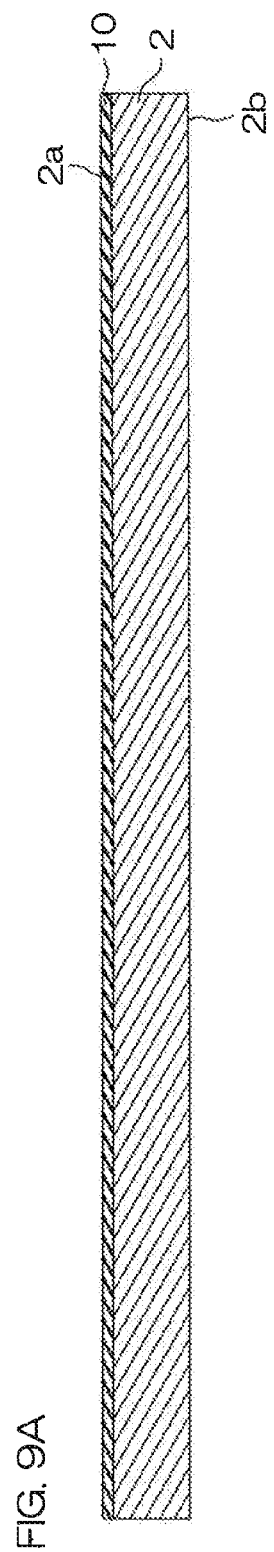
FIG. 9A is a sectional view of an example of a manufacturing process of the inkjet printing head.

FIG. 9A to FIG. 9O are sectional views of an example of a manufacturing process of the inkjet printing head 1 and are sectional views corresponding to FIG. 2A.

First, as shown in FIG. 9A, the movable film formation layer 10 is formed above the front surface 2a of the actuator substrate 2. However, as the actuator substrate 2, that which is thicker than the thickness of the actuator substrate 2 at the final stage is used. Specifically, a silicon oxide film (for example, of 1.2 μm thickness) is formed above the front surface of the actuator substrate 2. If the movable film formation layer 10 is constituted of a laminated film of a silicon film, a silicon oxide film, and a silicon nitride film, the silicon film (for example, of 0.4 μm thickness) is formed above the front surface of the actuator substrate 2, the silicon oxide film (for example, of 0.4 μm thickness) is formed above the silicon film, and the silicon nitride film (for example, of 0.4 μm thickness) is formed above the silicon oxide film.

A base oxide film, for example, of $Al_2O_3$, MgO, or $ZrO_2$, etc., may be formed above the front surface of the movable film formation layer 10. Such base oxide films prevent metal atoms from escaping from the piezoelectric films 12 that are to be formed later. When metal atoms escape, the piezoelectric films 12 may degrade in piezoelectric characteristics. Also, when metal atoms that have escaped become mixed in the silicon layer constituting the movable film 10A, the movable film 10A may degrade in durability.

Figure 9B:
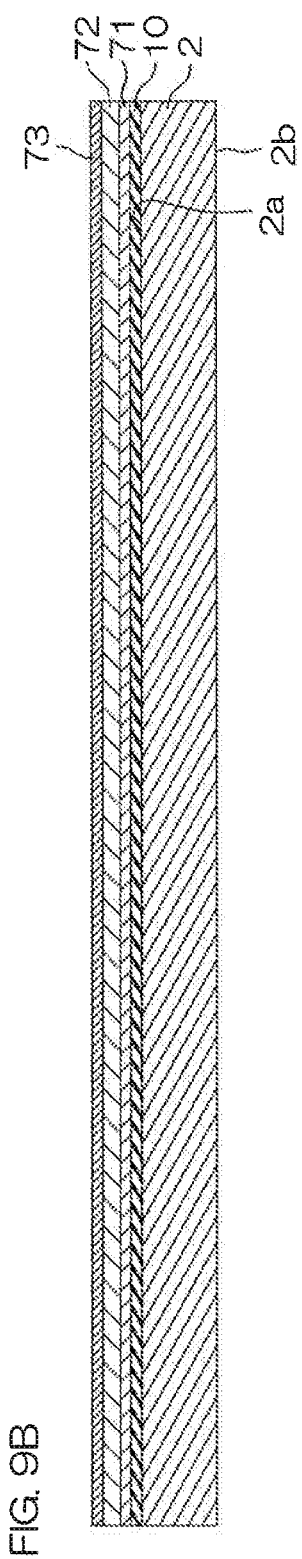
FIG. 9B is a sectional view of a step subsequent to that of FIG. 9A.

Next, a lower electrode film 71, which is a material layer of the lower electrode 11, is formed above the movable film formation layer 10 (above the base oxide film in the case where the base oxide film is formed) as shown in FIG. 9B. The lower electrode film 71 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 71 may be formed by a sputtering method.

Next, a material film (piezoelectric material film) 72 of the piezoelectric films 12 is formed above an entire surface of the lower electrode film 71. Specifically, for example, the piezoelectric material film 72 of him to Sum thickness is formed by a sol-gel method. Such a piezoelectric material film 72 is constituted of a sintered body of metal oxide crystal grains.

Next, an upper electrode film 73, which is a material of the upper electrode 13, is formed on the entire surface of the piezoelectric material film 72. The upper electrode film 73 may, for example, be a single film of platinum (Pt). The upper electrode film 73 may, for example, be an $IrO_2$/Ir laminated film having an $IrO_2$ film (for example, of 40 nm to 160 nm thickness) as a lower layer and an Ir film (for example, of 40 nm to 160 nm thickness) as an upper layer. Such an upper electrode film 73 may be formed by the sputtering method.

Figure 9D:
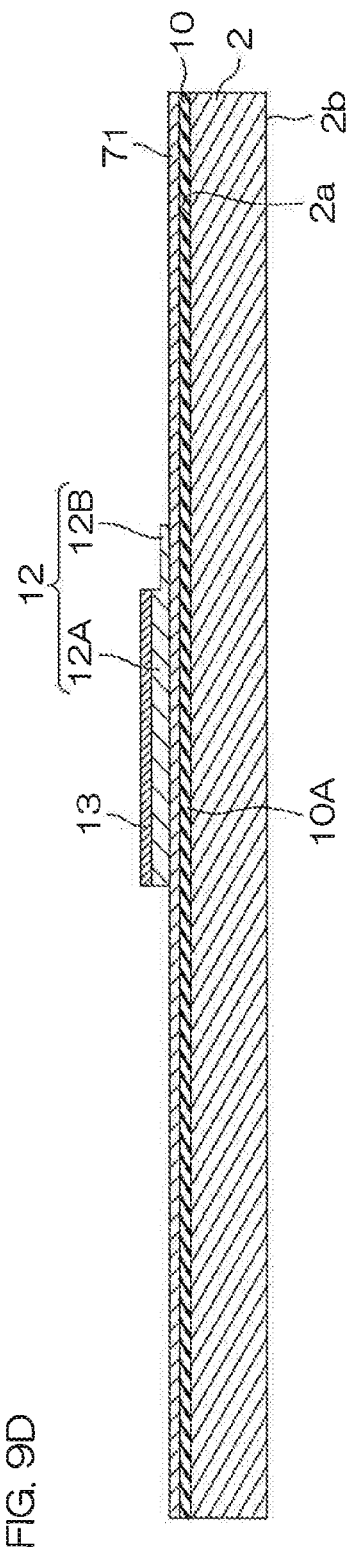
FIG. 9D is a sectional view of a step subsequent to that of FIG. 9C.

Next, as shown in FIG. 9C to FIG. 9E, patterning of the upper electrode film 73, the piezoelectric material film 72, and the lower electrode film 71 is performed. First, a resist mask with a pattern of the upper electrode 73 is formed by photolithography. Then as shown in FIG. 9C, the upper electrode film 73 is etched using the resist mask as a mask to form the upper electrode 13 of the predetermined pattern. Thereafter, overetching is performed by continuing the etching to thin a portion of the piezoelectric material film 72 exposed from the upper electrode 13. A thickness of the portion of the piezoelectric material film 72 exposed from the upper electrode 13 is thereby made, for example, approximately ½ the thickness of the portion covered by the upper electrode 13.

After then peeling off the resist mask, a resist mask with a pattern of the piezoelectric films 12 is formed by photolithography. Then as shown in FIG. 9D, the piezoelectric material film 72 is etched using the resist mask as a mask to form the piezoelectric films 12 of the predetermined pattern. The piezoelectric films 12, each constituted of the active portion 12A with the upper surface in contact with the lower surface of the upper electrode 13 and the inactive portion 12B having a thickness thinner than the active portion 12A, are thereby formed.

After then peeling off the resist mask, a resist mask with a pattern of the lower electrode 11 is formed by photolithography. Then as shown in FIG. 9E, the lower electrode film 71 is etched using the resist mask as a mask to form the lower electrode 11 of the predetermined pattern. The lower electrode 11, constituted of the main electrode portion 11A and the extension portion 11B having the penetrating hole 23, is thereby formed. The piezoelectric elements 9, each constituted of the main electrode portion 11A of the lower electrode 11, the active portion 12A of the piezoelectric film 12, and the upper electrode 12, are thereby formed.

Figure 9F:
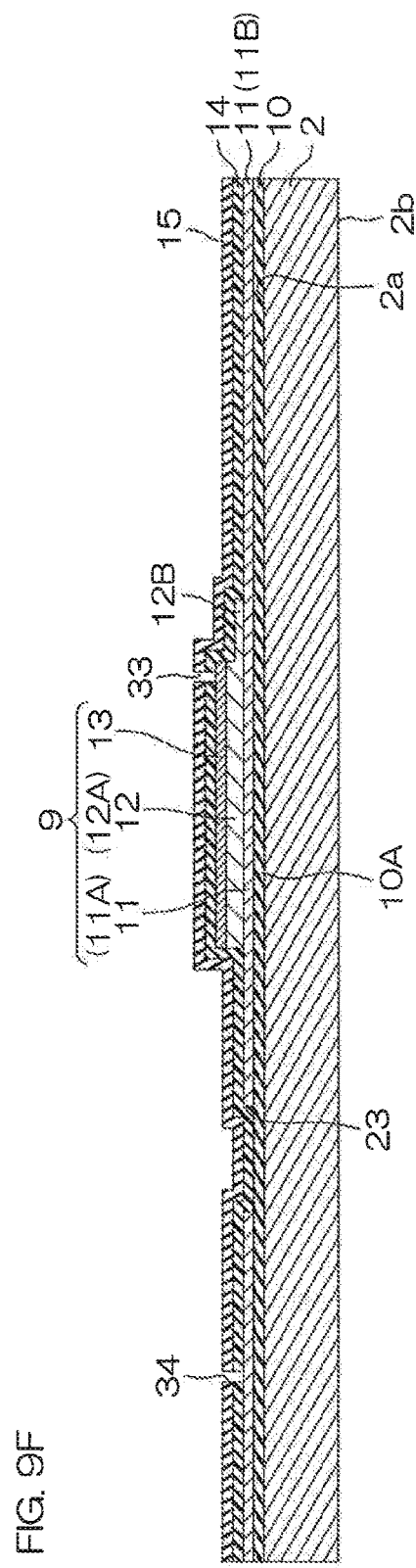
FIG. 9F is a sectional view of a step subsequent to that of FIG. 9E.

After then peeling off the resist mask, the first hydrogen barrier film 14 covering the entire surface is formed as shown in FIG. 9F. The first hydrogen barrier film 14 may be an $Al_2O_3$ film formed by the sputtering method and may have a film thickness of 50 nm to 100 nm. Thereafter, the insulating film 15 is formed above the entire surface of the first hydrogen barrier film 14. The insulating film 15 may be an $SiO_2$ film and may have a film thickness of 200 nm to 300 nm. Next, the contact holes 33 and 34 are formed by successively etching the insulating film 15 and the first hydrogen barrier film 14.

Next, as shown in FIG. 9G, a wiring film that constitutes the upper wirings 17, the lower wiring 18, and the dummy wirings 19 is formed by the sputtering method on the insulating film 15 and inside the contact holes 33 and 34. Thereafter, the wiring film is patterned by photolithography and etching to form the upper wirings 17, the lower wiring 18, and the dummy wirings 19 at the same time.

Figure 9H:
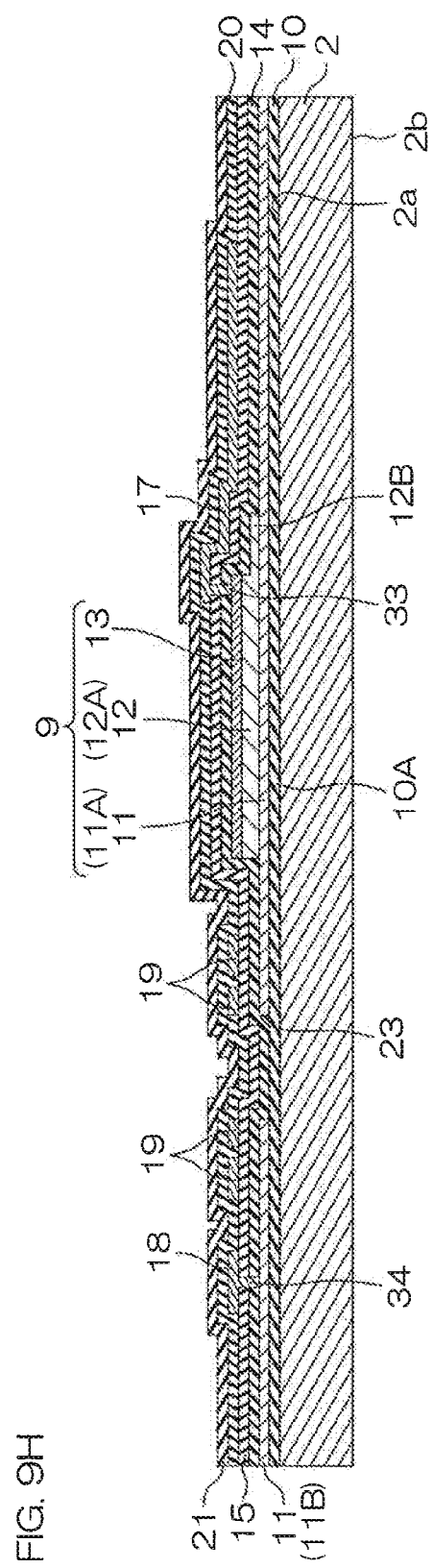
FIG. 9H is a sectional view of a step subsequent to that of FIG. 9G.
Figure 9:
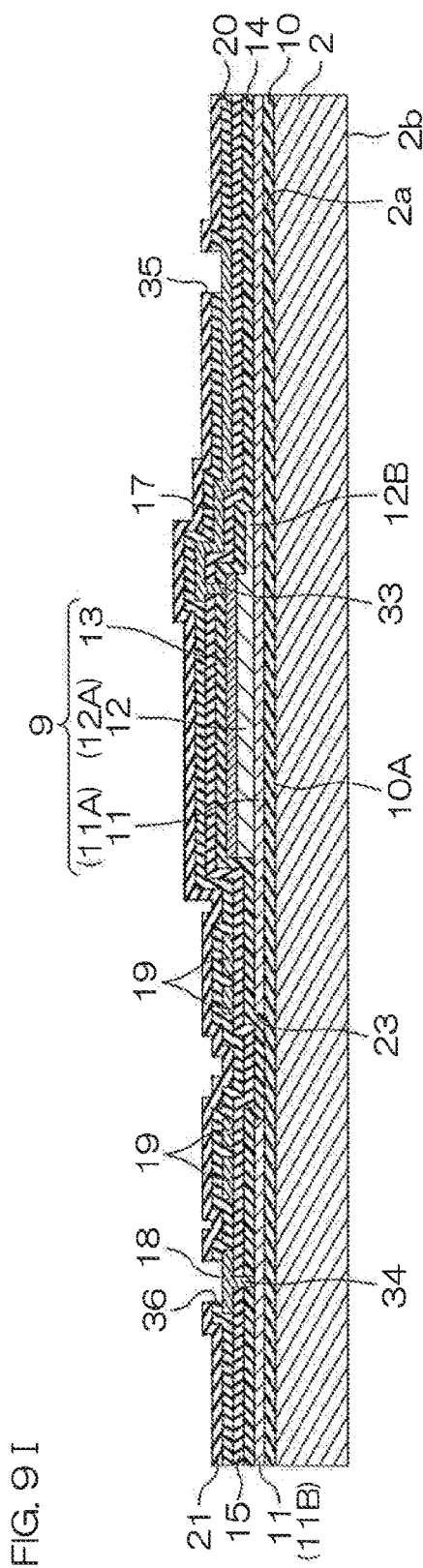
FIG. 9C is a sectional view of a step subsequent to that of FIG. 9B.
FIG. 9E is a sectional view of a step subsequent to that of FIG. 9D.
FIG. 9G is a sectional view of a step subsequent to that of FIG. 9F.
FIG. 9I is a sectional view of a step subsequent to that of FIG. 9H.
FIG. 9J is a sectional view of a step subsequent to that of FIG. 9I.
FIG. 9K is a sectional view of a step subsequent to that of FIG. 9J.
FIG. 9L is a sectional view of a step subsequent to that of FIG. 9K.
FIG. 9M is a sectional view of a step subsequent to that of FIG. 9L.
FIG. 9N is a sectional view of a step subsequent to that of FIG. 9M.
FIG. 9O is a sectional view of a step subsequent to that of FIG. 9N.

Next, as shown in FIG. 9H, the second hydrogen barrier film 20 that covers the wirings 17, 18, and 19 is formed on the front surface of the insulating film 15. The second hydrogen barrier film 20 may be an $Al_2O_3$ film formed by the sputtering method and may have a film thickness of 50 nm to 100 nm. Thereafter, the passivation film 21 is formed above the entire surface of the second hydrogen barrier film 20. The passivation film 21 is constituted, for example, of SiN. The passivation film 21 is formed, for example, by plasma CVD.

The following problem may occur if the passivation film 21 is formed without forming the second hydrogen barrier film 20, covering the wirings 17, 18, and 19, on the front surface of the insulating film 15. When the passivation film 21 is formed, hydrogen is generated. The hydrogen passes through the upper wirings 17, the contact holes 33, and the upper electrodes 13 and reaches the piezoelectric films 21. The piezoelectric films 12 are thereby hydrogen-reduced. Consequently, withstand voltage failure of the piezoelectric films 12 may occur or degradation of hysteresis characteristics of the piezoelectric films 12 may occur.

With the present preferred embodiment, the second hydrogen barrier film 20, covering the wirings 17, 18, and 19, is formed on the front surface of the insulating film 15 and thereafter the passivation film 21 is formed above the second hydrogen barrier film 20. The upper wiring 17 is thus covered by the second hydrogen barrier film 20 when the passivation film 21 is being formed. The hydrogen generated when the passivation film 21 is formed can thereby be prevented from passing through the upper wirings 17, the contact holes 33, and the upper electrodes 13 and reaching the piezoelectric films 12. Degradation of characteristics of the piezoelectric films 12 due to hydrogen reduction can thus be prevented during the process of forming the passivation film 21.

Next, a resist mask, having openings corresponding to the pad openings 35 and 36, is formed by photolithography, and using the resist mask as a mask, the second hydrogen barrier film 20 and the passivation film 21 are etched. The pad openings 35 and 36 are thereby formed in the second hydrogen barrier film 20 and the passivation film 21 as shown in FIG. 9I.

Figure 9J:
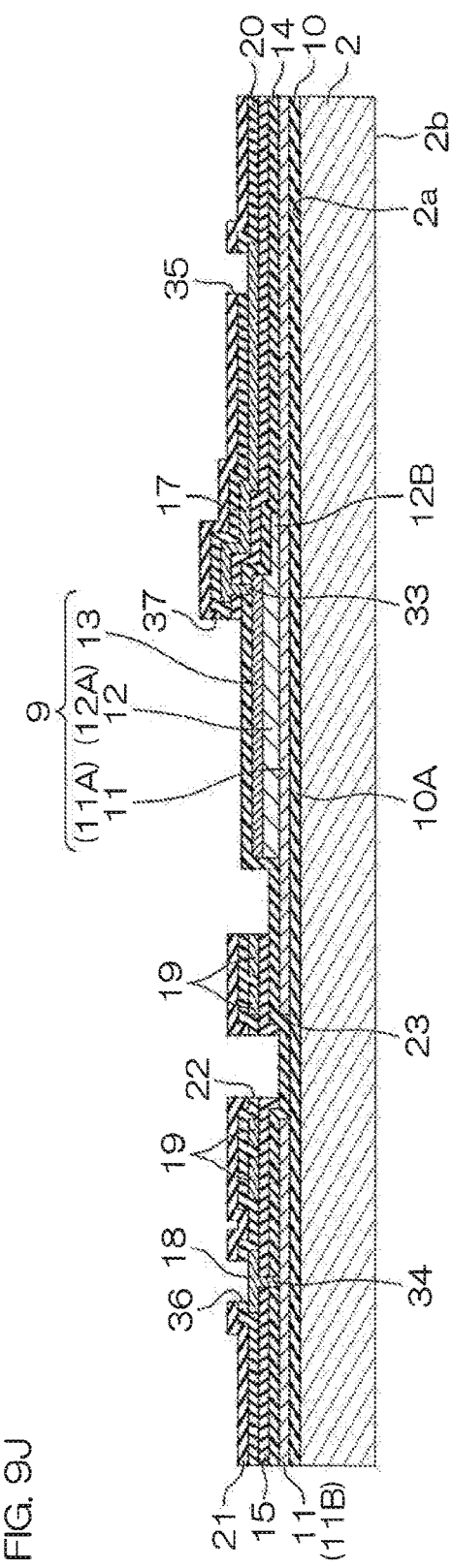

Next, the resist mask is peeled off. A resist mask having openings corresponding to the opening 37 and the ink supply passage 22 is then formed by photolithography, and using the resist mask as a mask, the passivation film 21, the second hydrogen barrier film 20, and the insulating film 15 are etched successively. The opening 37 and the ink supply passage 22 are thereby formed in the passivation film 21, the second hydrogen barrier film 20, and the insulating film 15 as shown in FIG. 9J.

Figure 9K:
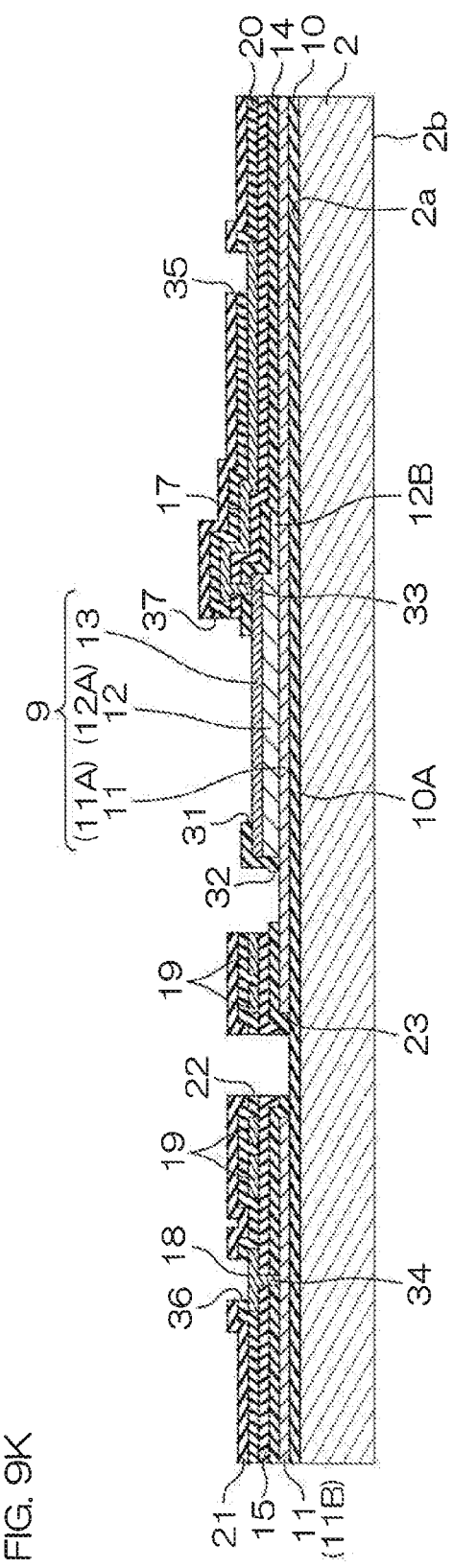

Next, the resist mask is peeled off. A resist mask having openings corresponding to the openings 31 and 32 and the ink supply passage 22 is then formed by photolithography, and using the resist mask as a mask, the first hydrogen barrier film 14 is patterned. The openings 31 and 32 and the ink supply passage 22 are thereby formed in the first hydrogen barrier film 14 as shown in FIG. 9K.

Figure 9L:
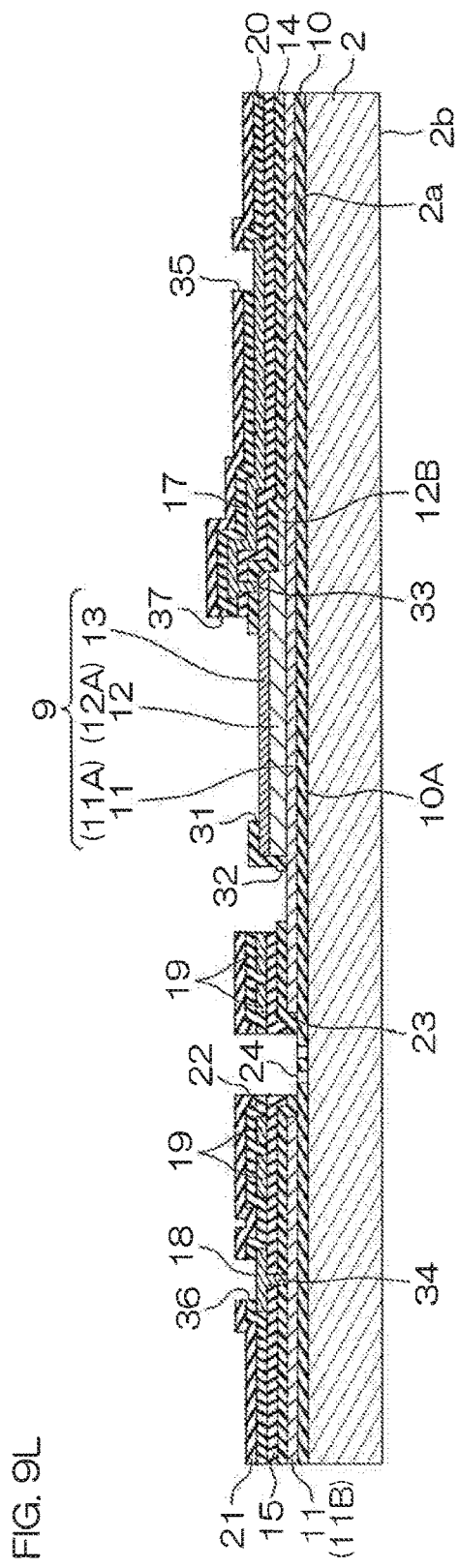

Next, the resist mask is peeled off. Then as shown in FIG. 9L, the ink flow-through holes 24 are formed in the movable film formation layer 10 by photolithography and etching.

Figure 9M:
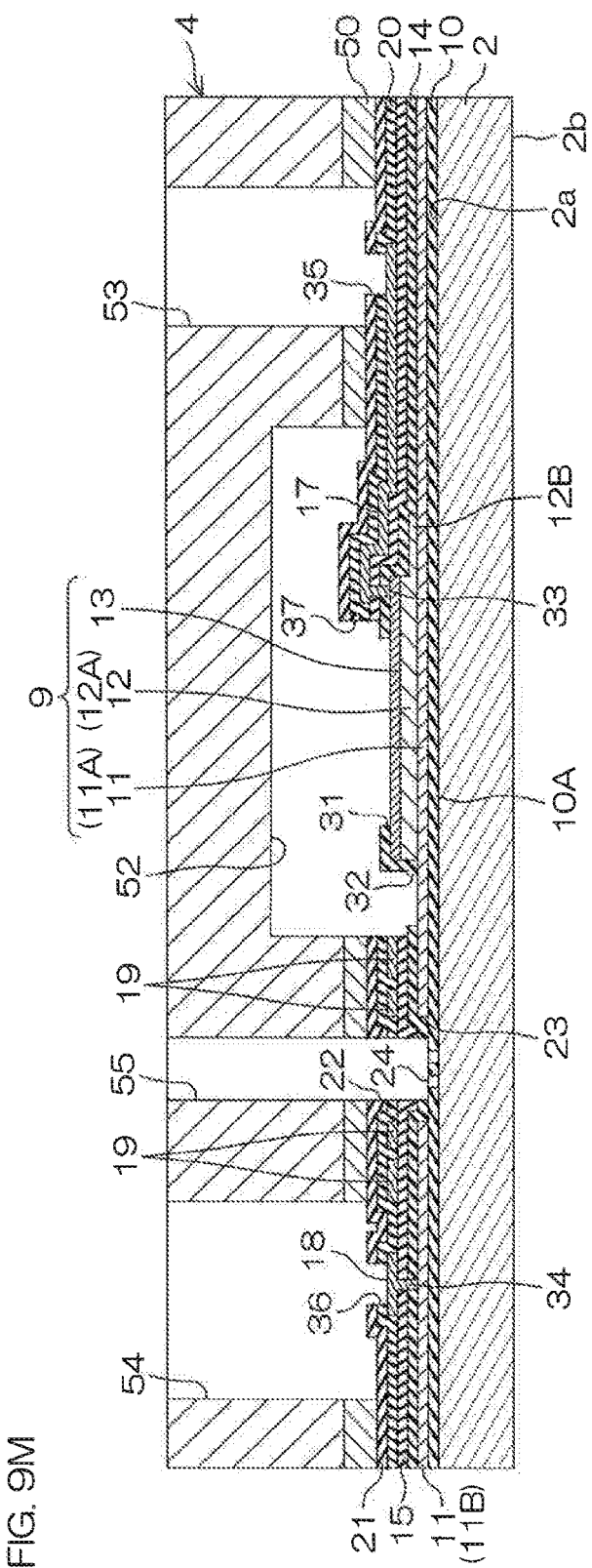

Next, as shown in FIG. 9M, an adhesive 50 is coated onto the facing surface 51 of the protective substrate 4 and the protective substrate 4 is fixed onto the actuator substrate 2 so that the ink supply passage 55 and the ink supply passage 22 are matched.

Figure 9N:
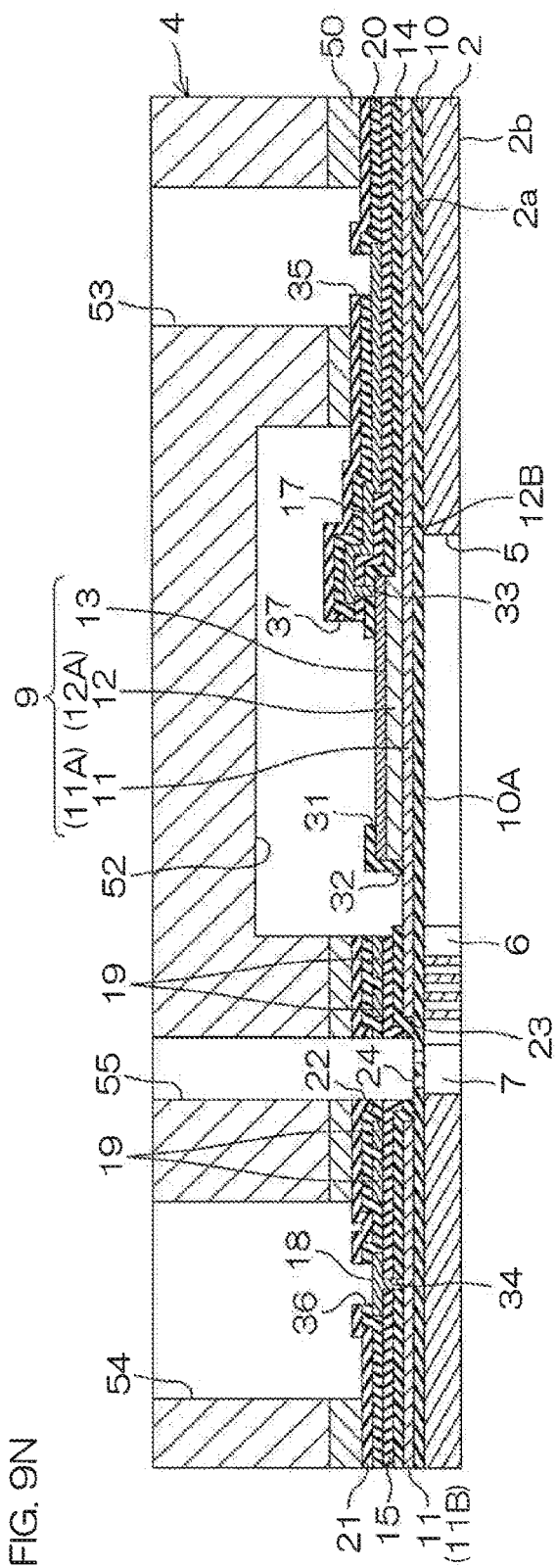
Figure 90:
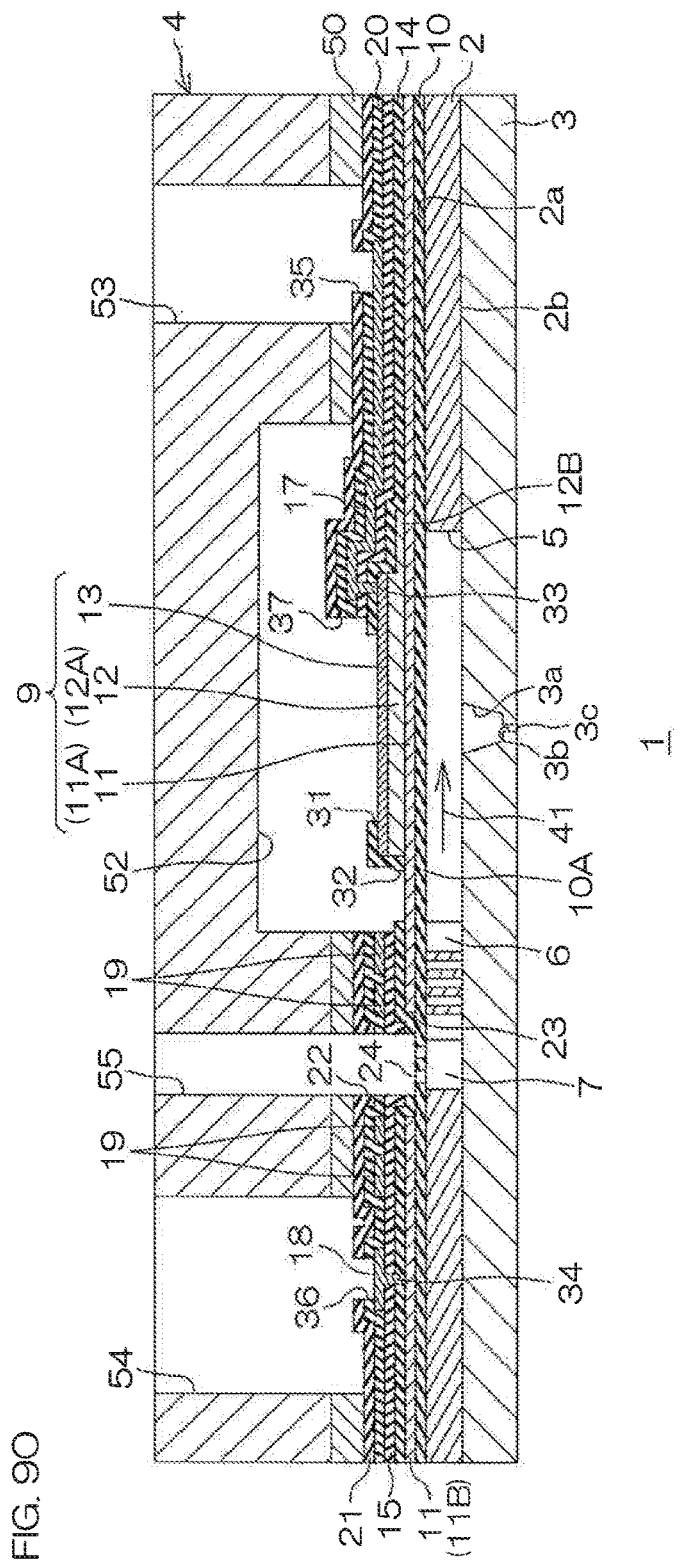

Next, as shown in FIG. 9N, rear surface grinding for thinning the actuator substrate 2 is performed. The actuator substrate 2 is made thin by the actuator substrate 2 being ground from the rear surface 2b. For example, the actuator substrate 2 with a thickness of approximately 670 μm in the initial state may be thinned to a thickness of approximately 300 μm. Next, etching (dry etching or wet etching) from the rear surface of the actuator substrate 2 is performed on the actuator substrate 2 to form the pressure chambers 5, the restriction flow passages 6, and the ink inflow portions 7.

In the etching process, the base oxide film formed on the front surface of the movable film formation layer 10 prevents the escaping of metal elements (Pb, Zr, and Ti in the case of PZT) from the piezoelectric film 12 and keeps the piezoelectric characteristics of the piezoelectric film 12 in a satisfactory state. Also as mentioned above, the base oxide film formed on the front surface of the movable film formation layer 10 contributes to maintaining the durability of silicon layer that forms the movable film 10A.

Thereafter, as shown in FIG. 9O, the nozzle substrate 3 is adhered onto the rear surface of the actuator substrate 2 and the inkjet printing head 1 is thereby obtained.

Although a preferred embodiment has been described above, the present invention may be implemented in yet other preferred embodiments. Although the restriction flow passages 6 are of the form shown in FIG. 4 in the preferred embodiment described above, these may be of the form shown in FIG. 10 instead. Here, each restriction flow passage 6 includes a meandering flow passage 62 that is formed in a meandering configuration in a plan view. In a plan view, the meandering flow passage 62 includes a plurality of rectilinear portions 62a that are disposed parallel to each other at intervals in the direction orthogonal to the ink flow direction 41 and connecting portions 62b each connecting end portions of adjacent rectilinear portions 62a so as to join the rectilinear portions 62a to form a single flow passage. One end of the meandering flow passage 62 is connected to the pressure chamber 5 and another end of the meandering flow passage 62 is connected to the ink inflow portion 7. The depth of the restriction flow passage 6 may be the same as a depth of the pressure chamber 5 or may be shallower than that of the pressure chamber 5.

Also, although in the preferred embodiments described above, the insulating film 15 is formed on a portion of the front surface of the first hydrogen barrier film 14, the insulating film 15 may instead be formed on the entirety of the front surface of the first hydrogen barrier film 14.

Also, although in the preferred embodiments, the insulating film 15 is formed on a portion of the front surface of the first hydrogen barrier film 14, the insulating film 15 may be omitted.

Also, although in the preferred embodiments, the openings 31 and 32 are formed in the first hydrogen barrier film 14, the openings 31 and 32 do not have to be formed in the first hydrogen barrier film 14.

Also, although in the preferred embodiments, the second hydrogen barrier film 20, covering the wirings 17, 18, and 19, is formed above the insulating film 15, the second hydrogen barrier film 20 may be omitted.

Also, although in the preferred embodiments, the restriction flow passage 6 has the meandering flow passage 61 or 62, the restriction flow passage 6 does not have to have the meandering flow passage 61 or 62.

Also, although with the preferred embodiments, PZT was cited as an example of the material of the piezoelectric film, a piezoelectric material besides this that is constituted of a metal oxide as represented by lead titanate ($PbPO_3$), potassium niobate ($KNbO_3$), lithium niobate (LiNbO3), lithium tantalate ($LiTaO_3$), etc., may be applied instead.

Also, although with the preferred embodiments described above, cases where the present invention is applied to an inkjet printing head was described, the present invention may also be applied to a piezoelectric microphone, pressure sensor, etc., that uses a piezoelectric element.

Besides the above, various design changes may be applied within the scope of the matters described in the claims.

The following further features (may hereinafter be referred to as a "second invention") can be extracted from the present specification.

A1. An inkjet printing head including an actuator substrate having a pressure chamber, a restriction flow passage in communication with the pressure chamber, and an ink inflow portion in communication with the restriction flow passage, a movable film disposed above the pressure chamber and defining a top surface portion of the pressure chamber, and a piezoelectric element formed above the movable film, and where the restriction flow passage includes a meandering flow passage formed in a meandering configuration in a plan view of viewing from a direction normal to a major surface of the movable film.

With this arrangement, the restriction flow passage includes the meandering flow passage and therefore a fluid resistance of the entire restriction flow passage with respect to a length of a restriction flow passage formation region (length between the ink inflow portion and the pressure chamber) can be increased in comparison to a rectilinear restriction flow passage described in Japanese Patent Application Publication No. 2013-215930. The length of the restriction flow passage formation region can thereby be shortened. The inkjet printing head can thereby be reduced in size.

A2. The inkjet printing head according to "A1.," where, in a plan view, the meandering flow passage includes a plurality of rectilinear portions that are disposed parallel to each other at intervals and a plurality of connecting portions each connecting end portions of adjacent rectilinear portions so as to join the rectilinear portions to form a single flow passage.

A3. The inkjet printing head according to "A1" or "A2.," further including a nozzle substrate defining a bottom surface portion of the pressure chamber and having an ink discharge port in communication with the pressure chamber. With this arrangement, when ink inside the pressure chamber is pressurized, the ink inside the pressure chamber is discharged from the ink discharge port.

A4. The inkjet printing head according to any one of "A1." to "A3.," where the piezoelectric element has a lower electrode formed above the movable film, a piezoelectric film formed above the lower electrode, and an upper electrode formed above the piezoelectric film.

A5. The inkjet printing head according to "A4.," including a hydrogen barrier film having an opening at an upper surface center of the upper electrode and covering an upper surface peripheral edge portion of the upper electrode and entireties of side surfaces of the upper electrode and the piezoelectric film.

With this arrangement, the piezoelectric film deforms readily because the hydrogen barrier film has the opening at the upper surface center of the upper electrode. A displacement amount of the movable film can thereby be made large.

A6. The inkjet printing head according to "A5.," where, in a plan view of viewing from a direction normal to a major surface of the movable film, each of the upper electrode and the piezoelectric film has a peripheral edge that is receded further toward an interior of the pressure chamber than the movable film and a region in which the hydrogen barrier film is not formed is present within a region between the hydrogen barrier film covering the side surface of the piezoelectric film and a peripheral edge of the movable film.

With this arrangement, the displacement of the movable film can be increased because the upper electrode and the piezoelectric film are not disposed above the peripheral edge portion of the movable film. Further with this arrangement, the displacement amount of the movable film can be increased further because a region in which the hydrogen barrier film is not formed is present within a region between the hydrogen barrier film covering the side surface of the piezoelectric film and a peripheral edge of the movable film.

A7. The inkjet printing head according to "A6.," where the pressure chamber is formed to a rectangular shape in the plan view, the movable film is formed to a rectangular shape matching the peripheral edge of the pressure chamber in the plan view, the piezoelectric film is, in the plan view, a rectangle having a width shorter than a width in a short direction of the movable film and a length shorter than a length in a long direction of the movable film, with both end edges and both side edges thereof being receded further toward the interior of the movable film than both end edges and both side edges, respectively, of the movable film, and the upper electrode is, in the plan view, a rectangle having a width shorter than the width in a short direction of the movable film and a length shorter than the length in a long direction of the movable film, with both end edges and both side edges thereof being receded further toward the interior of the movable film than both end edges and both side edges, respectively, of the movable film.

With this arrangement, the displacement of the movable film can be made large because the upper electrode and the piezoelectric film are not disposed above the peripheral edge portion of the movable film.

A8. The inkjet printing head according to any one of "A5." to "A7.," further including an insulating film formed above the hydrogen barrier film and where a contact hole, exposing a portion of the upper electrode, is formed in the hydrogen barrier film and the insulating film above the piezoelectric element, and a wiring, having one end portion connected to the upper electrode via the contact hole and another end portion being led out to an outer side of the piezoelectric element, is formed above the insulating film.

With this arrangement, the upper electrode can be connected to a drive circuit of the piezoelectric element via the wiring.

A9. The inkjet printing head according to "A8.," further including a passivation film formed above the insulating film and covering the wiring.

With this arrangement, the wiring can be protected by the passivation film.

A10. The inkjet printing head according to any one of "A5." to "A9.," where the hydrogen barrier film is constituted of $Al_2O_3$.

A11. The inkjet printing head according to any one of "A4." to "A10.," where the piezoelectric film is constituted of a PZT film.

A12. The inkjet printing head according to any one of "A4." to "A11.," where the upper electrode is constituted of a Pt single film.

A13. The inkjet printing head according to any one of "A4." to "A11.," where the upper electrode is constituted of a laminated film of an $IrO_2$ formed above the piezoelectric film and an Ir film formed above the $IrO_2$ film.

A14. The inkjet printing head according to any one of "A4." to "A13.," where the lower electrode is constituted of a Ti film formed at the movable film side and a Pt film formed above the Ti film.

A15. The inkjet printing head according to any one of "A4." to "A14.," where the movable film is constituted of an $SiO_2$ single film.

A16. The inkjet printing head according to any one of "A4." to "A14.," where the movable film is constituted of a laminated film of an Si film formed above the substrate, an $SiO_2$ film formed above the Si film, and an SiN film formed above the $SiO_2$ film.

Figure 11:
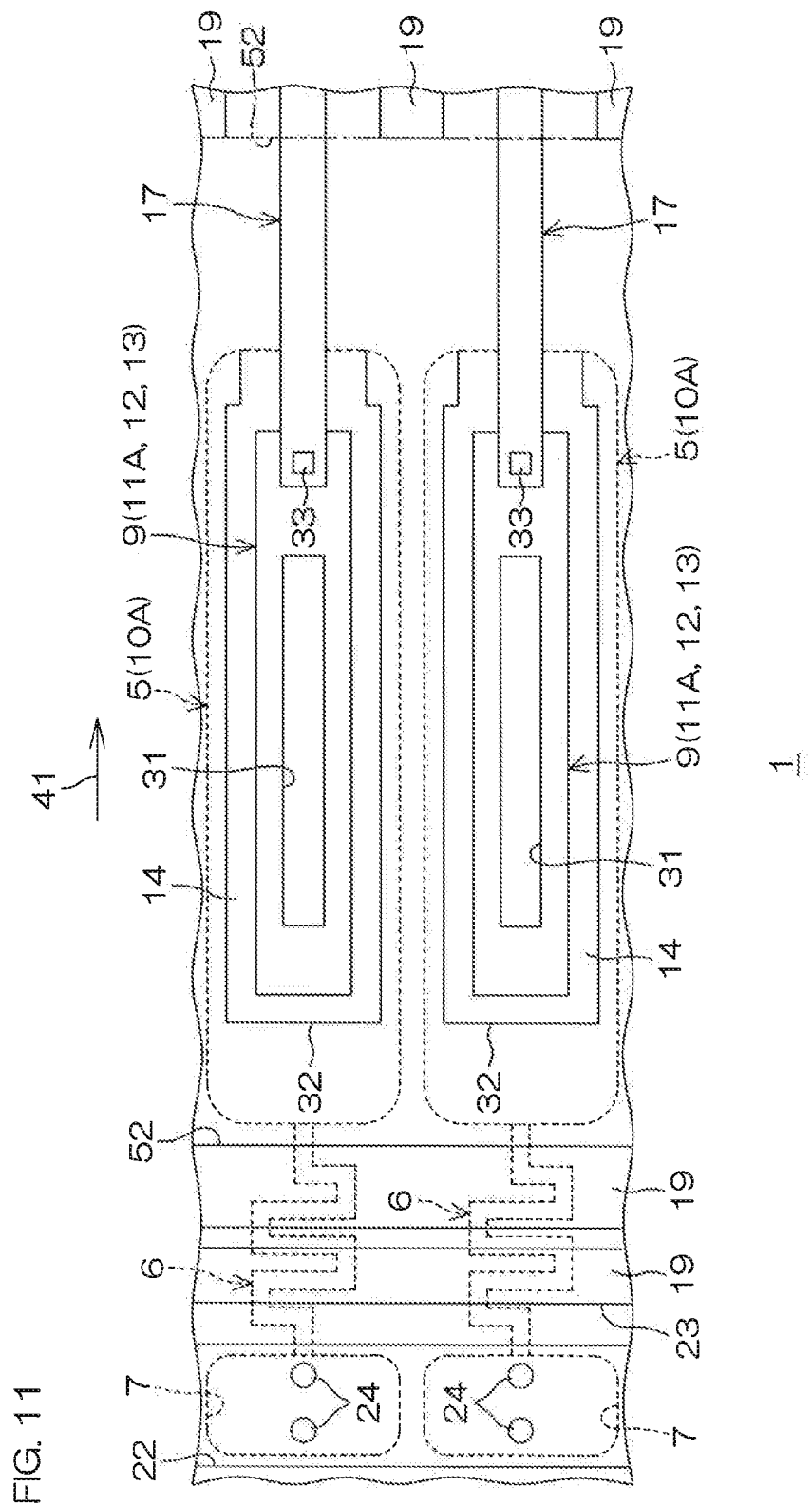
FIG. 11 is an illustrative plan view of another example of a pattern of a piezoelectric film.

With the second invention having the feature of "A1." above, the piezoelectric film 12 is not required to have the inactive portion 12B. That is, the piezoelectric film 12 may be formed to a rectangular shape of the same pattern as the upper electrode 13 in a plan view as shown in FIG. 11. In this case, each of the upper electrode 13 and the piezoelectric film 12 has a peripheral edge that is receded further toward the interior of the pressure chamber 5 than the movable film 10A.

Figure 12:
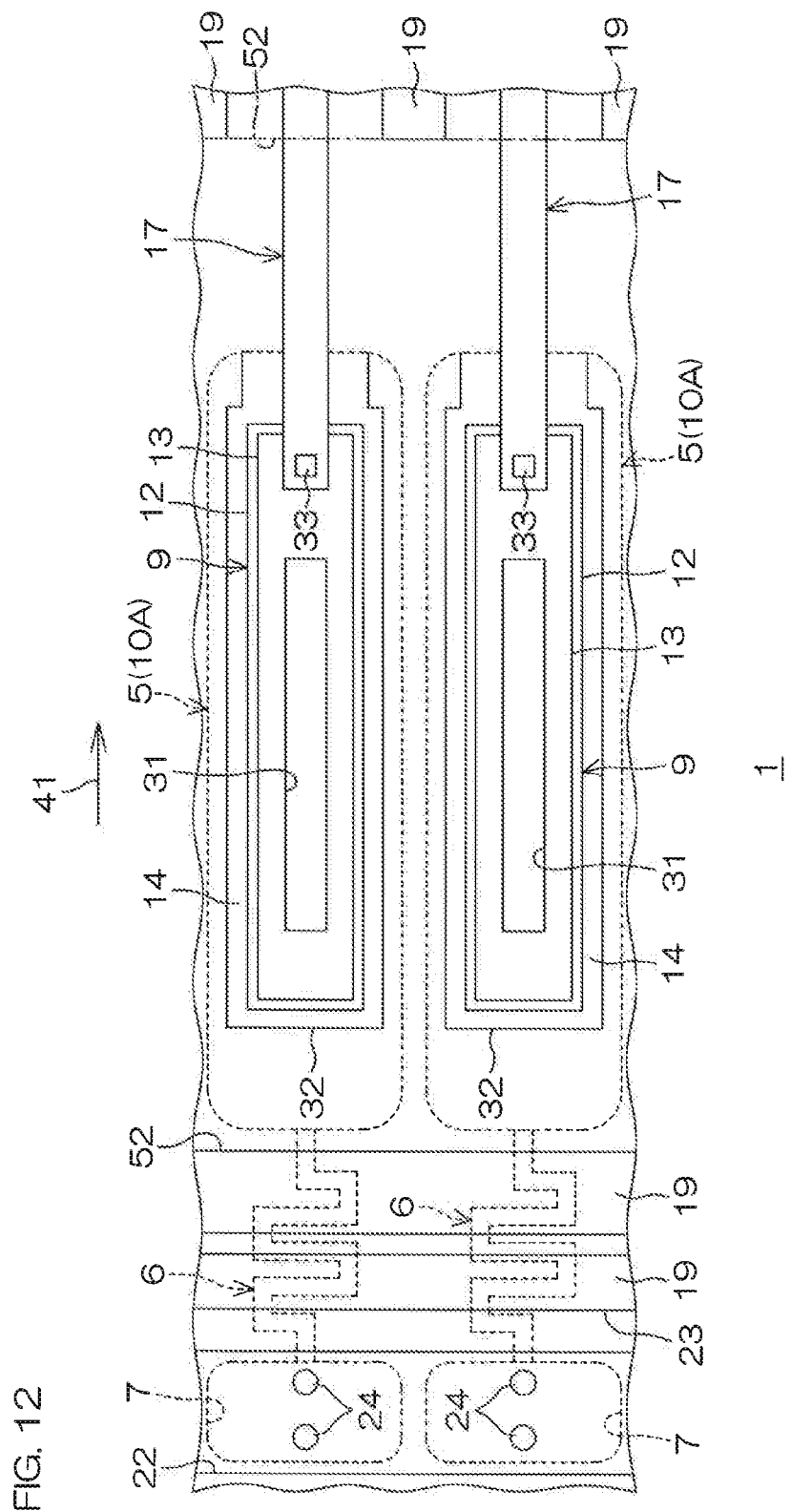
FIG. 12 is an illustrative plan view of yet another example of a pattern of a piezoelectric film.

Also, the piezoelectric film 12 may be formed to a rectangular shape of a pattern having a peripheral edge, which, in a plan view, is positioned further outward than the peripheral edge of the upper electrode and is receded further toward the interior of the pressure chamber 5 than the movable film 10A as shown in FIG. 12.

The present application corresponds to Japanese Patent Application No. 2014-180486 filed on Sep. 4, 2014 in the Japan Patent Office, Japanese Patent Application No. 2014-180488 filed on Sep. 4, 2014 in the Japan Patent Office and Japanese Patent Application No. 2015-140650 filed on Jul. 14, 2015 in the Japan Patent Office, and the entire disclosure of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A device using a piezoelectric element comprising:
a substrate having a cavity;
a movable film formation layer including a movable film disposed above the cavity and defining a top surface portion of the cavity; and
a piezoelectric element formed above the movable film, the piezoelectric element including a lower electrode formed above the movable film, a piezoelectric film formed above the lower electrode, and an upper electrode formed above the piezoelectric film, the upper electrode having, in a plan view of viewing from a direction normal to a major surface of the movable film, a peripheral edge that is receded further toward an interior of the cavity than the movable film;

a wiring having one end portion connected to an upper surface of the upper electrode and having another end portion led out to an outer side of a peripheral edge of the cavity in the plan view;

wherein the piezoelectric film has an active portion with an upper surface in contact with a lower surface of the upper electrode and an inactive portion extending along a lower surface of the wiring from a side portion of the active portion to an outer side of the peripheral edge of the cavity, a hydrogen barrier film, having an opening at an upper surface center of the upper electrode and covering a peripheral edge portion of the upper surface of the upper electrode, entireties of side surfaces of the upper electrode and the piezoelectric film, and an upper surface of the inactive portion of the piezoelectric film; and an insulating film, formed above the hydrogen barrier film and disposed between the hydrogen barrier film and the wiring;

wherein a contact hole, exposing a portion of the upper electrode is formed in the hydrogen barrier film and the insulating film and the one end portion of the wiring is connected to the upper electrode via the contact hole.

2. The device using the piezoelectric element according to claim 1, wherein a thickness of the inactive portion is thinner than a thickness of the active portion.

3. The device using the piezoelectric element according to claim 1, further comprising a passivation film formed above the insulating film and covering the wiring.

4. The device using the piezoelectric element according to claim 1, wherein the movable film formation layer is constituted of an $SiO_2$ single film.

5. The device using the piezoelectric element according to claim 1, wherein the piezoelectric film is constituted of a PZT film.

6. The device using the piezoelectric element according to claim 1, wherein the upper electrode is constituted of a Pt single film.

7. The device using the piezoelectric element according to claim 2, further comprising a passivation film formed above the insulating film and covering the wiring.

8. The device using the piezoelectric element according to claim 1, wherein the cavity is formed to a rectangular shape in the plan view, the movable film is formed to a rectangular shape matching the peripheral edge of the cavity in the plan view, each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the wiring, in the plan view, extends from one end portion of the upper electrode to beyond the peripheral edge of the cavity along an extension in a long direction of the upper electrode, and the inactive portion of the piezoelectric film, in the plan view, extends from one end portion of the active portion corresponding to the one end portion of the upper electrode to the outer side beyond the peripheral edge of the cavity along an extension in a long direction of the active portion.

9. The device using the piezoelectric element according to claim 2, wherein the cavity is formed to a rectangular shape in the plan view, the movable film is formed to a rectangular shape matching the peripheral edge of the cavity in the plan view, each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the wiring, in the plan view, extends from one end portion of the upper electrode to beyond the peripheral edge of the cavity along an extension in a long direction of the upper electrode, and the inactive portion of the piezoelectric film, in the plan view, extends from one end portion of the active portion corresponding to the one end portion of the upper electrode to the outer side beyond the peripheral edge of the cavity along an extension in a long direction of the active portion.

10. The device using the piezoelectric element according to claim 3, wherein the cavity is formed to a rectangular shape in the plan view, the movable film is formed to a rectangular shape matching the peripheral edge of the cavity in the plan view, each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the wiring, in the plan view, extends from one end portion of the upper electrode to beyond the peripheral edge of the cavity along an extension in a long direction of the upper electrode, and the inactive portion of the piezoelectric film, in the plan view, extends from one end portion of the active portion corresponding to the one end portion of the upper electrode to the outer side beyond the peripheral edge of the cavity along an extension in a long direction of the active portion.

11. The device using the piezoelectric element according to claim 7, wherein the cavity is formed to a rectangular shape in the plan view, the movable film is formed to a rectangular shape matching the peripheral edge of the cavity in the plan view, each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the wiring, in the plan view, extends from one end portion of the upper electrode to beyond the peripheral edge of the cavity along an extension in a long direction of the upper electrode, and the inactive portion of the piezoelectric film, in the plan view, extends from one end portion of the active portion corresponding to the one end portion of the upper electrode to the outer side beyond the peripheral edge of the cavity along an extension in a long direction of the active portion.

12. A device using a piezoelectric element comprising:

a substrate having a cavity;

a movable film formation layer including a movable film disposed above the cavity and defining a top surface portion of the cavity; and a piezoelectric element formed above the movable film, the piezoelectric element including a lower electrode formed above the movable film, a piezoelectric film formed above the lower electrode, and an upper electrode formed above the piezoelectric film, the upper electrode having, in a plan view of viewing from a direction normal to a major surface of the movable film, a peripheral edge that is receded further toward an interior of the cavity than the movable film;

a wiring having one end portion connected to an upper surface of the upper electrode and having another end portion led out to an outer side of a peripheral edge of the cavity in the plan view;

wherein the piezoelectric film has an active portion with an upper surface in contact with a lower surface of the upper electrode and an inactive portion extending along a lower surface of the wiring from a side portion of the active portion to an outer side of the peripheral edge of the cavity, the cavity is formed to a rectangular shape in the plan view, the movable film is formed to a rectangular shape matching the peripheral edge of the cavity in the plan view, each of the upper electrode and the active portion of the piezoelectric film is, in the plan view, a rectangle having a width shorter than a width in a short direction of the movable film and a length shorter than a length in a long direction of the movable film, with both end edges and both side edges thereof being receded further toward an interior of the movable film than both end edges and both side edges, respectively, of the movable film, the wiring, in the plan view, extends from one end portion of the upper electrode to beyond the peripheral edge of the cavity along an extension in a long direction of the upper electrode, and the inactive portion of the piezoelectric film, in the plan view, extends from one end portion of the active portion corresponding to the one end portion of the upper electrode to the outer side beyond the peripheral edge of the cavity along an extension in a long direction of the active portion.

13. The device using the piezoelectric element according to claim 12, wherein a thickness of the inactive portion is thinner than a thickness of the active portion.

14. A device using a piezoelectric element comprising:

a substrate having a cavity;

a movable film formation layer including a movable film disposed above the cavity and defining a top surface portion of the cavity; and a piezoelectric element formed above the movable film, the piezoelectric element including a lower electrode formed above the movable film, a piezoelectric film formed above the lower electrode, and an upper electrode formed above the piezoelectric film, the upper electrode having, in a plan view of viewing from a direction normal to a major surface of the movable film, a peripheral edge that is receded further toward an interior of the cavity than the movable film;

a wiring having one end portion connected to an upper surface of the upper electrode and having another end portion led out to an outer side of a peripheral edge of the cavity in the plan view;

wherein the piezoelectric film has an active portion with an upper surface in contact with a lower surface of the upper electrode and an inactive portion extending along a lower surface of the wiring from a side portion of the active portion to an outer side of the peripheral edge of the cavity, and the movable film formation layer is constituted of a laminated film of an Si film formed above the substrate, an $SiO_2$ film formed above the Si film, and an SiN film formed above the $SiO_2$ film.

15. A device using a piezoelectric element comprising:

a substrate having a cavity;

a movable film formation layer including a movable film disposed above the cavity and defining a top surface portion of the cavity; and a piezoelectric element formed above the movable film, the piezoelectric element including a lower electrode formed above the movable film, a piezoelectric film formed above the lower electrode, and an upper electrode formed above the piezoelectric film, the upper electrode having, in a plan view of viewing from a direction normal to a major surface of the movable film, a peripheral edge that is receded further toward an interior of the cavity than the movable film;

a wiring having one end portion connected to an upper surface of the upper electrode and having another end portion led out to an outer side of a peripheral edge of the cavity in the plan view;

wherein the piezoelectric film has an active portion with an upper surface in contact with a lower surface of the upper electrode and an inactive portion extending along a lower surface of the wiring from a side portion of the active portion to an outer side of the peripheral edge of the cavity, and the upper electrode is constituted of a laminated film of an $IrO_2$ film formed above the piezoelectric film and an Ir film formed above the $IrO_2$ film.

16. A device using a piezoelectric element comprising:

a substrate having a cavity;

a movable film formation layer including a movable film disposed above the cavity and defining a top surface portion of the cavity; and a piezoelectric element formed above the movable film, the piezoelectric element including a lower electrode formed above the movable film, a piezoelectric film formed above the lower electrode, and an upper electrode formed above the piezoelectric film, the upper electrode having, in a plan view of viewing from a direction normal to a major surface of the movable film, a peripheral edge that is receded further toward an interior of the cavity than the movable film;

a wiring having one end portion connected to an upper surface of the upper electrode and having another end portion led out to an outer side of a peripheral edge of the cavity in the plan view;

wherein the piezoelectric film has an active portion with an upper surface in contact with a lower surface of the upper electrode and an inactive portion extending along a lower surface of the wiring from a side portion of the active portion to an outer side of the peripheral edge of the cavity, and the lower electrode is constituted of a laminated film of a Ti film formed at the movable film side and Pt film formed above the Ti film.

\* \* \* \* \*